(12) United States Patent
Kihara et al.

(10) Patent No.: US 10,553,446 B2
(45) Date of Patent: *Feb. 4, 2020

(54) METHOD OF PROCESSING TARGET OBJECT

(71) Applicant: Tokyo Electron Limited, Tokyo (JP)

(72) Inventors: Yoshihide Kihara, Miyagi (JP); Toru Hisamatsu, Miyagi (JP); Masahiro Tabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/458,378

(22) Filed: Jul. 1, 2019

(65) Prior Publication Data

US 2019/0326125 A1 Oct. 24, 2019

Related U.S. Application Data

(63) Continuation of application No. 15/954,802, filed on Apr. 17, 2018.

(30) Foreign Application Priority Data

Apr. 18, 2017 (JP) ................................. 2017-082026
Mar. 14, 2018 (JP) ................................. 2018-046977

(51) Int. Cl.
*H01L 21/311* (2006.01)
*H01L 21/683* (2006.01)
(Continued)

(52) U.S. Cl.
CPC ...... *H01L 21/31116* (2013.01); *C23C 16/042* (2013.01); *C23C 16/45525* (2013.01); *H01J 37/3244* (2013.01); *H01L 21/0228* (2013.01); *H01L 21/02211* (2013.01); *H01L 21/31144* (2013.01); *H01L 21/67069* (2013.01); *H01L 21/67109* (2013.01); *H01L 21/67248* (2013.01);
(Continued)

(58) Field of Classification Search
CPC .................................................. H01L 21/31116
USPC ........................................................ 438/695
See application file for complete search history.

(56) References Cited

U.S. PATENT DOCUMENTS 6,764,940 B1 7/2004 Rozbicki
2015/0235861 A1 8/2015 Mizuno et al.

FOREIGN PATENT DOCUMENTS

JP 2006-523030 A 10/2006
JP 2014-017438 A 1/2014
(Continued)

*Primary Examiner* — Roberts P Culbert
(74) *Attorney, Agent, or Firm* — Pearne & Gordon LLP

(57) ABSTRACT

A method includes anisotropically etching an etching target layer of a target object through an opening of the target object by generating plasma of a first gas within a processing vessel in which the target object is accommodated; and then forming a film on an inner surface of the opening by repeating a sequence comprising: a first process of supplying a second gas into the processing vessel; a second process of purging a space within the processing vessel; a third process of generating plasma of a third gas containing an oxygen atom within the processing vessel; and a fourth process of purging the space within the processing vessel. The first gas contains a carbon atom and a fluorine atom. The second gas contains an aminosilane-based gas. The etching target layer is a hydrophilic insulating layer containing silicon. Plasma of the first gas is not generated in the first process.

21 Claims, 11 Drawing Sheets

(51) Int. Cl.
*H01L 21/67* (2006.01)
*H01L 21/02* (2006.01)
*C23C 16/455* (2006.01)
*C23C 16/04* (2006.01)
*H01J 37/32* (2006.01)
*C23C 16/40* (2006.01)
*C23C 16/34* (2006.01)

(52) U.S. Cl.
CPC ........ *H01L 21/6831* (2013.01); *C23C 16/345* (2013.01); *C23C 16/402* (2013.01); *H01J 37/3255* (2013.01); *H01J 37/32183* (2013.01); *H01J 2237/002* (2013.01); *H01J 2237/334* (2013.01); *H01J 2237/3321* (2013.01); *H01L 21/6833* (2013.01)

(56) References Cited

FOREIGN PATENT DOCUMENTS

| | | |
|---|---|---|
| WO | 2004/093176 A1 | 10/2004 |
| WO | 2014/046083 A1 | 3/2014 |

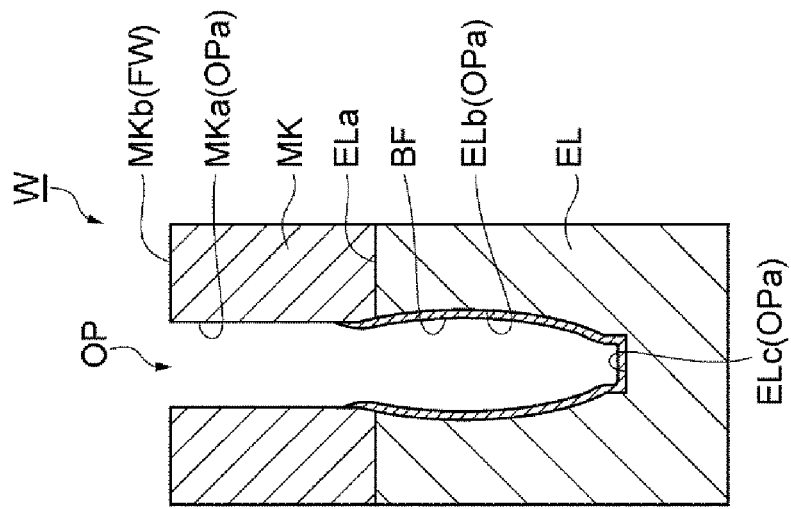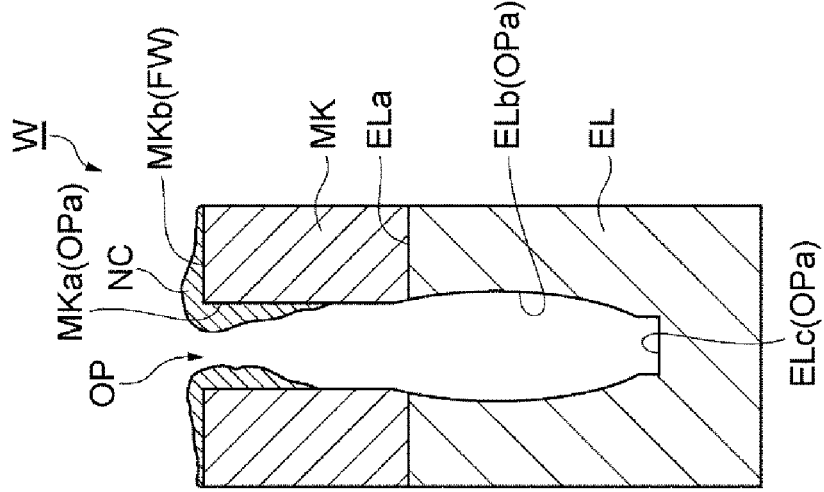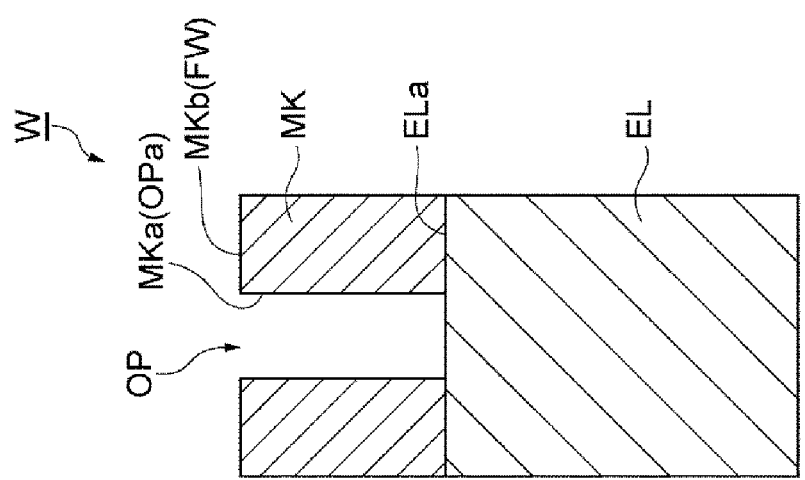

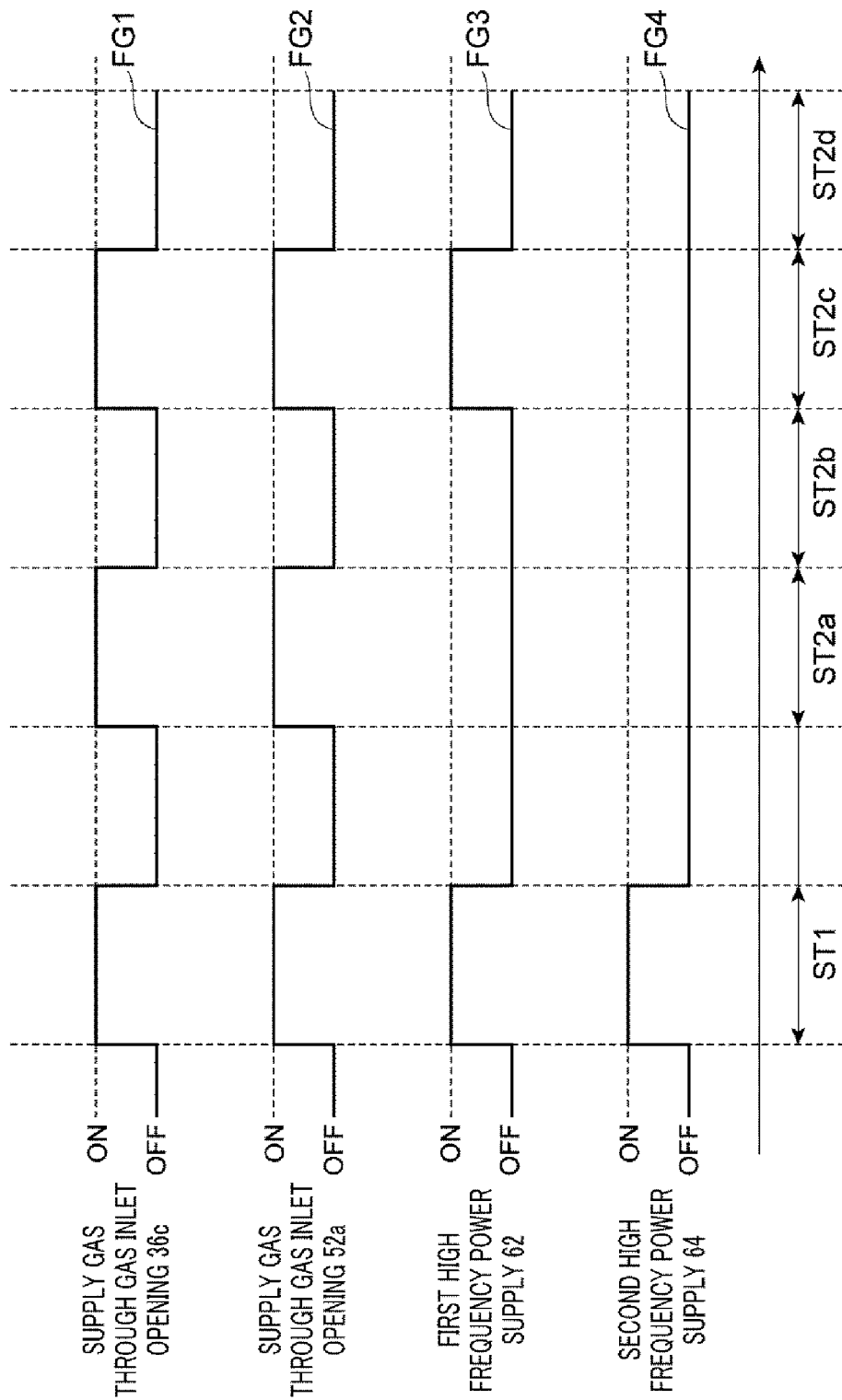

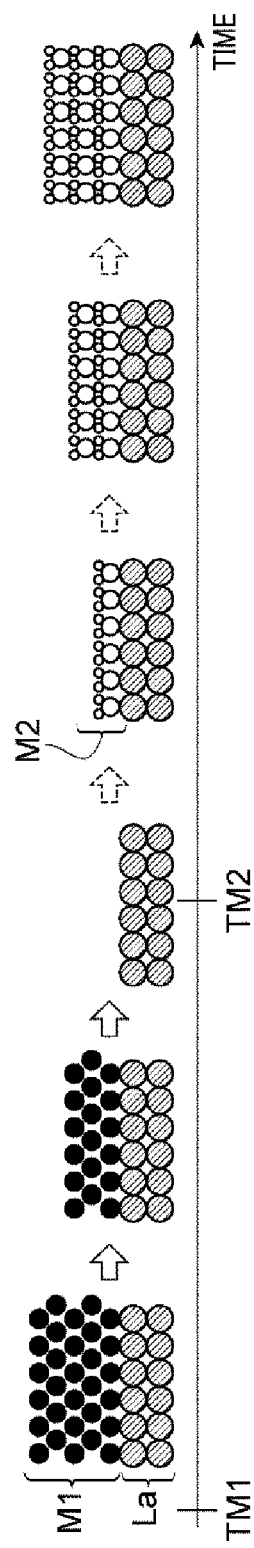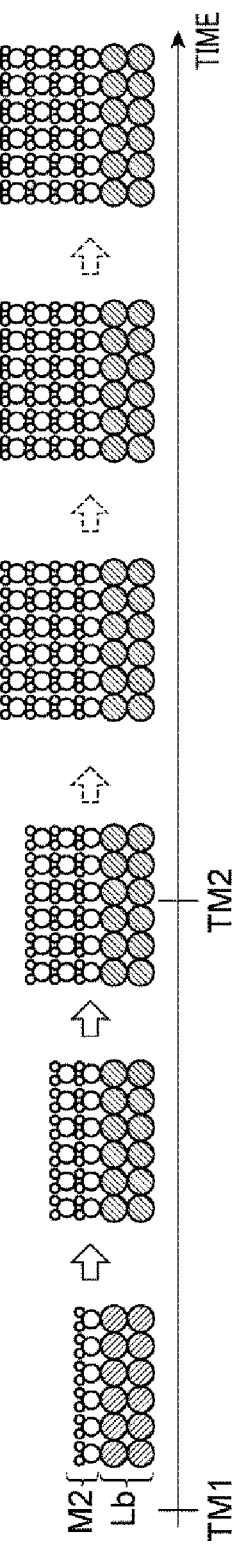

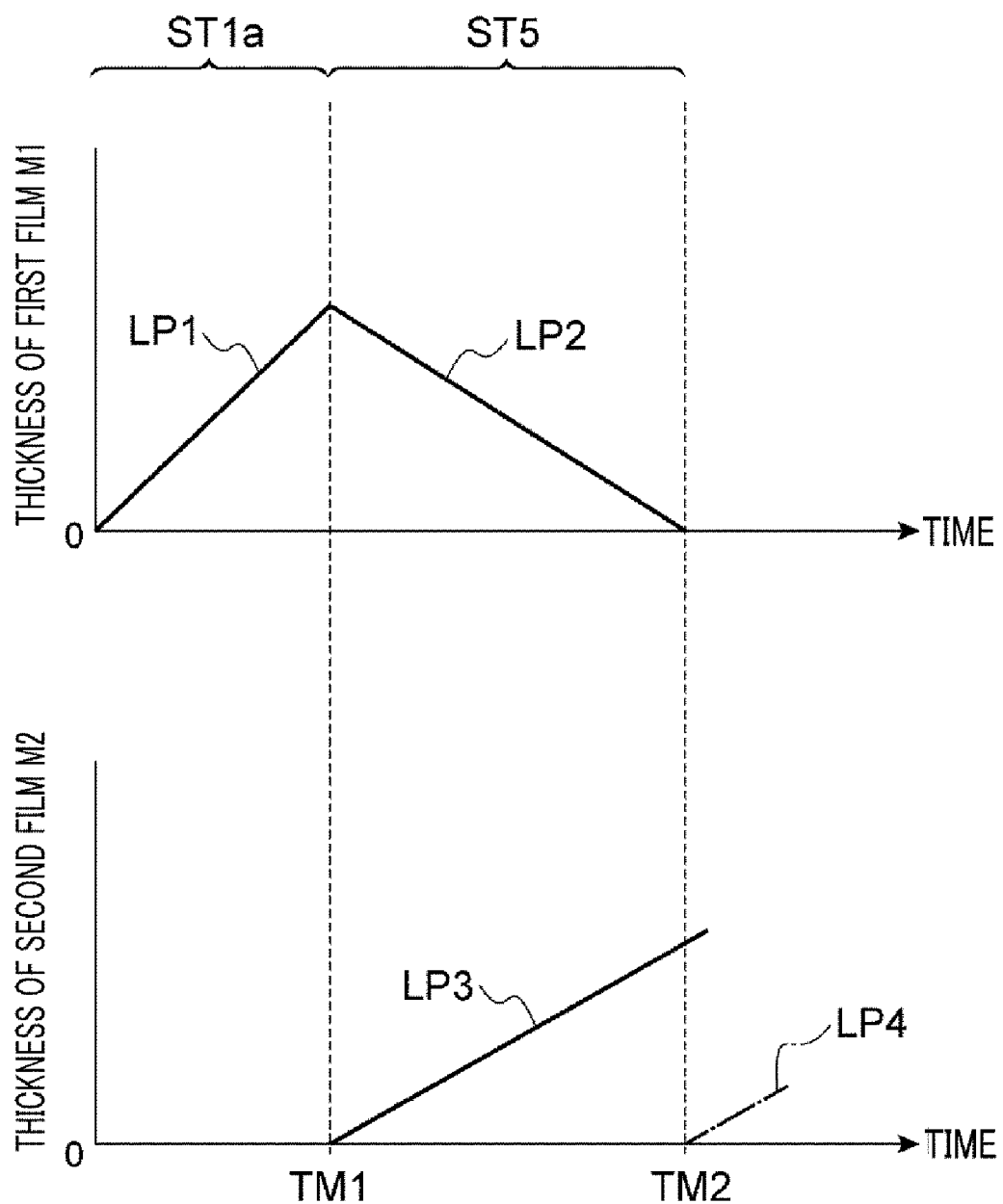

METHOD OF PROCESSING TARGET OBJECT

CROSS-REFERENCE TO RELATED APPLICATION

This is a continuation application of U.S. patent application Ser. No. 15/954,802, filed on Apr. 17, 2018, which claims the benefit of Japanese Patent Application Nos. 2017-082026 and 2018-046977 filed on Apr. 18, 2017 and Mar. 14, 2018, respectively, the entire disclosures of which are incorporated herein by reference.

TECHNICAL FIELD

The embodiments described herein pertain generally to a method of processing a target object.

BACKGROUND

In a manufacturing process of an electronic device, a mask is formed on a target layer, and etching is performed to transfer a pattern of the corresponding mask to the target layer. Patent Document 1 discloses a technique of improving a shape of a hole of the pattern formed by the etching. Patent Document 2 discloses a technique for forming a recess pattern on a substrate successfully by etching and film forming. Patent Document 3 discloses a technique of performing etching periodically while forming a protective film of the mask.

Patent Document 1: International Publication No. WO2014/046083 pamphlet
Patent Document 2: Japanese Patent Laid-open Publication No. 2014-017438
Patent Document 3: Japanese Patent Laid-open Publication No. 2006-523030

SUMMARY

There is a demand for a technique of selectively forming a film on a required region of a target object with high controllability.

In one example embodiment, there is provided a method of processing a target object. The target object has an etching target layer and a mask provided on the etching target layer. The mask is provided with an opening reaching the etching target layer. The method includes anisotropically etching the etching target layer through the opening (hereinafter, referred to as process a); and forming a film on an inner surface of the opening after performing the process a (hereinafter, referred to as process b). In the process a, plasma of a first gas is generated within a processing vessel of a plasma processing apparatus in which the target object is accommodated. In the process b, the film is formed on the inner surface of the opening by repeating a sequence comprising: a first process of supplying a second gas into the processing vessel; a second process of purging a space within the processing vessel after the first process; a third process of generating plasma of a third gas containing an oxygen atom within the processing vessel after the second process; and a fourth process of purging the space within the processing vessel after the third process. The first gas contains a carbon atom and a fluorine atom. The second gas contains an organic-containing aminosilane-based gas. The etching target layer is a hydrophilic insulating layer containing silicon. Plasma of the first gas is not generated in the first process.

Through the etching performed in the process a, a deposit as a reaction product originated from the first gas is attached to the opening, and a bowing shape (recess) may be formed at a portion of the inner surface of the opening where no deposit is attached (where the etching target layer is exposed). According to the method of the exemplary embodiment, through the process b performed after the process a, the deposit adhering to the opening is removed, and a film is formed on the portion where the bowing shape is formed, so that the bowing shape can be reduced.

In the first process, the etching target layer is etched through the opening while a temperature of the target object is adjusted to be uniform across regions of the target object. In the first processing using the second gas, since chemical reaction is made without generating plasma, a thickness of the film formed through the process b including the first process is increased with a rise of a temperature of the target object (particularly, the etching target layer) on which the film is formed. Accordingly, according to the method of the present exemplary embodiment, the thickness of the film formed in the process b can be uniformed across multiple regions of the target object.

The processing vessel is provided with a first gas inlet opening and a second gas inlet opening. The first gas inlet opening is provided above the target object. The second gas inlet opening is provided at a side of the target object. In the process a, the first gas is supplied into the processing vessel from the first gas inlet opening and a backflow prevention gas is supplied into the processing vessel from the second gas inlet opening. In the first process of the process b, the second gas is supplied into the processing vessel from the second gas inlet opening and the backflow prevention gas is supplied into the processing vessel from the first gas inlet opening. In the third process of the process b, the third gas is supplied into the processing vessel from the first gas inlet opening and the backflow prevention gas is supplied into the processing vessel from the second gas inlet opening. A pipeline connected to the first gas inlet opening and a pipeline connected to the second gas inlet opening are not intersected with each other. The second gas inlet opening through which the second gas, which is used in the first process and contains the organic-containing aminosilane-based gas having relatively high reactivity, is introduced into the processing vessel and the first gas inlet opening through which the first gas, which is used in the process a and contains the carbon atom and the fluorine atom, and the third gas, which is used in the third process and contains the oxygen atom, are introduced into the processing vessel are different from each other. Further, a gas supply line connected to the first gas inlet opening and a gas supply line connected to the second gas inlet opening are not intersected with each other. Therefore, it is possible to reduce the reaction product that might be originated from the second gas including the organic-containing aminosilane-based gas having the relatively high reactivity and the first and third gases and that might be generated within the gas supply lines. Furthermore, by using the backflow prevention gas, it is possible to suppress any of the first gas, the second gas and the third gas from flowing back into the gas supply line in which any of the first gas, the second gas and the third gas is not flowing.

The first gas includes a fluorocarbon-based gas. The etching upon the etching target layer made of the hydrophilic insulating layer containing the silicon can be performed in the process a by using the first gas containing the fluorocarbon-based gas.

The second gas includes monoaminosilane. The formation of the reaction precursor of the silicon can be performed in the first process by using the second gas containing the monoaminosilane.

The aminosilane-based gas contained in the second gas includes aminosilane having 1 to 3 silicon atoms. The aminosilane-based gas contained in the second gas includes aminosilane having one to three amino groups. As stated, the aminosilane having the one to three silicon atoms may be used as the aminosilane-based gas contained in the second gas. Further, the aminosilane having the one to three amino groups may be used as the aminosilane-based gas contained in the second gas.

In another exemplary embodiment, there is provided a method of processing a target object. The method includes selectively forming a first film on a surface of the target object; and forming a second film on the surface of the target object by atomic layer deposition while removing the first film.

The deposition includes a sequence comprising: a first process of supplying a second gas into a processing vessel to form an adsorption layer on the surface of the target object; a second process of purging a space within the processing vessel; and a third process of generating plasma of a third gas within the processing vessel.

The deposition further comprises a fourth process of exposing the second film to an inert gas plasma after the third process.

In the forming of the second film, the first film is removed through the third process or the fourth process.

The second gas is any of an aminosilane-based gas, a silicon-containing gas, a titanium-containing gas, a hafnium-containing gas, a tantalum-containing gas, a zirconium-containing gas and an organic-containing gas, and the third gas is any of an oxygen-containing gas, a nitrogen-containing gas and a hydrogen-containing gas.

The first film is formed by plasma etching.

The plasma etching is atomic layer etching.

In still another exemplary embodiment, there is provided a method of processing a target object. The method includes preparing a target object having a first region made of a first material and a second region made of a second material different from the first material; forming a first gas into plasma to etch the first region, thereby forming a first film on the second region; and forming a second film on the first region by atomic layer deposition while removing the first film.

The first gas includes a fluorocarbon gas, the first material includes silicon and oxygen, and the second material includes any of silicon, an organic material and a metal.

The first gas includes a fluorohydrocarbon gas, the first material includes silicon and nitrogen, and the second material includes any of silicon, an organic material and a metal.

The second film contains silicon.

The second film formed on the target object has multiple film thicknesses.

By repeating the sequence, the first film is removed and the second film is formed on the surface of the target object from which the first film is removed.

In accordance with the example embodiments, it is possible to provide a technique capable of forming the film selectively on the required region of the target object with high controllability.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4A is a cross sectional view illustrating a state of the target object obtained before processes shown in FIG. 1 are performed, FIG. 4B is a cross sectional view illustrating a state of the target object obtained after etching shown in FIG. 1 is performed, and FIG. 4C is a cross sectional view illustrating a state of the target object obtained after a sequence shown in FIG. 1 is performed multiple times;

FIG. 5 is a diagram illustrating states of a supply of a gas and a supply of a high frequency power from a high frequency power supply in the individual processes shown in FIG. 1;

FIG. 9A and FIG. 9B are diagrams schematically illustrating etching and formation of a film through the method shown in the flowchart of FIG. 7;

FIG. 10 is a diagram illustrating a variation in a film thickness while the method shown in the flowchart of FIG. 7 is performed.

DETAILED DESCRIPTION

Figure 1:
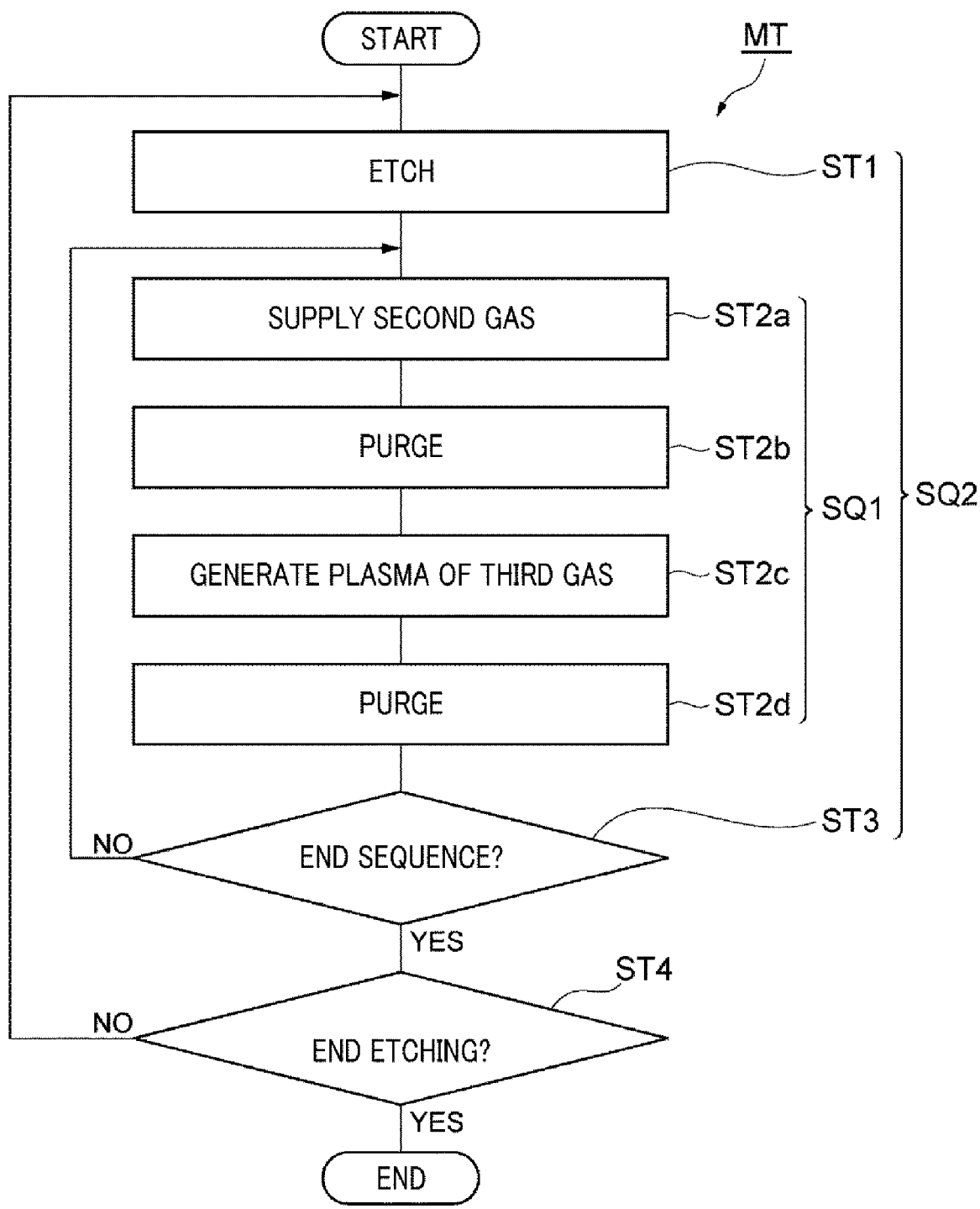
FIG. 1 is a flowchart illustrating a method of processing a target object according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

First Exemplary Embodiment

If a target layer is etched by using a mask which defines a pattern shape, a reaction product is deposited on an inner side surface of an opening (an opening of the mask) as the etching progresses. For this reason, necking, that is, clogging of the opening due to the deposition of the reaction product may take place. If a deposit of the reaction product is formed in the opening, ions in plasma collide with the corresponding deposit, and a travel direction of the ions is bent so that anisotropy thereof is lost. Accordingly, the ions may collide with the inner side surface of the opening and a bowing shape may be formed at a side surface thereof. If the bowing shape becomes conspicuous, inner sides of two neighboring openings may be penetrated. In this regard, there is a demand for a technique capable of suppressing the bowing shape at the inner side surface of the opening which might be caused by the etching. A first exemplary embodiment provides a technique of suppressing the bowing shape, which may be caused by the etching, at the inner side surface of the opening.

FIG. 1 is a flowchart for describing a method of processing a target object (hereinafter, referred to as "wafer W") according to the exemplary embodiment. A method MT shown in FIG. 1 is an example of a method of processing the target object. The method MT (the method of processing the target object) is performed by a plasma processing apparatus 10.

Figure 2:
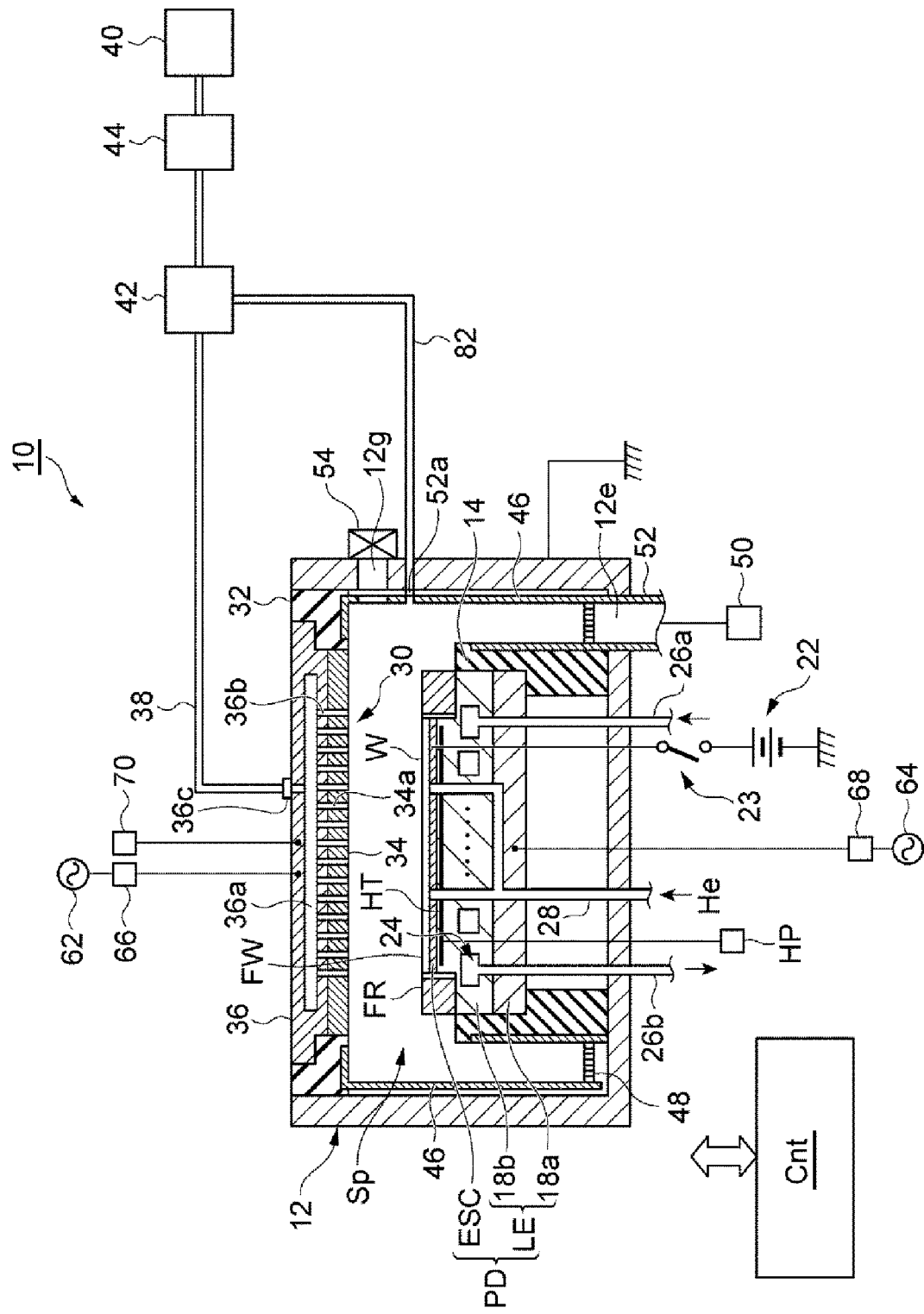
FIG. 2 is a diagram illustrating an example of a plasma processing apparatus according to the exemplary embodiment which is used in performing the method MT shown in FIG. 1.

FIG. 2 is a diagram illustrating an example of the plasma processing apparatus according to the exemplary embodiment which is used in performing the method MT shown in FIG. 1. FIG. 2 schematically illustrates a cross sectional structure of the plasma processing apparatus 10 which can be used in various exemplary embodiments of the method MT. As depicted in FIG. 2, the plasma processing apparatus 10 is configured as a plasma etching apparatus having parallel plate type electrodes, and is equipped with a processing vessel 12. The processing vessel 12 has a substantially cylindrical shape, and confines a processing space Sp. The processing vessel 12 is made of, by way of example, aluminum, and an inner wall surface thereof is anodically oxidized. The processing vessel 12 is frame-grounded.

A substantially cylindrical supporting member 14 is provided on a bottom portion of the processing vessel 12. The supporting member 14 is made of, by way of example, but not limitation, an insulating material. The insulating material forming the supporting member 14 may contain oxygen, such as quartz. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the wafer W on a top surface thereof. A main surface FW of the wafer W is at the opposite side to a rear surface of the wafer W which is in contact with the top surface of the mounting table PD, and faces the upper electrode 30. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, aluminum and have a substantially disk shape. The second plate 18b is provided on the first plate 18a, and is electrically connected with the first plate 18a.

The electrostatic chuck ESC is provided on the second plate 18b. The electrostatic chuck ESC includes a pair of insulating layers or insulating sheets; and an electrode embedded therebetween. The electrode of the electrostatic chuck ESC is implemented by a conductive film, and electrically connected to a DC power supply 22 via a switch 23. When the wafer W is placed on the mounting table PD, the wafer W is in contact with the electrostatic chuck ESC. Specifically, the rear surface (opposite to the main surface FW) of the wafer W is in contact with the electrostatic chuck ESC. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature control mechanism. A coolant is supplied into the coolant path 24 from a chiller unit (not shown) provided outside the processing vessel 12 via a pipeline 26a. The coolant supplied into the coolant path 24 is then returned back into the chiller unit via a pipeline 26b. In this way, the coolant is supplied and circulated through the coolant path 24. A temperature of the wafer W held by the electrostatic chuck ESC can be controlled by adjusting a temperature of the coolant.

Furthermore, the plasma processing apparatus 10 is provided with a gas supply line 28. A heat transfer gas, e.g., a He gas, from a heat transfer gas supply device is supplied into a gap between a top surface of the electrostatic chuck ESC and the rear surface of the wafer W through the gas supply line 28.

The plasma processing apparatus 10 is also equipped with a temperature control unit HT configured to adjust the temperature of the wafer W. The temperature control unit HT is embedded in the electrostatic chuck ESC, and is connected to a heater power supply HP. As a power is supplied to the temperature control unit HT from the heater power supply HP, the temperature of the electrostatic chuck ESC is adjusted, and, thus, the temperature of the wafer W placed on the electrostatic chuck ESC is adjusted. Alternatively, the temperature control unit HT may be embedded in the second plate 18b.

Figure 3:
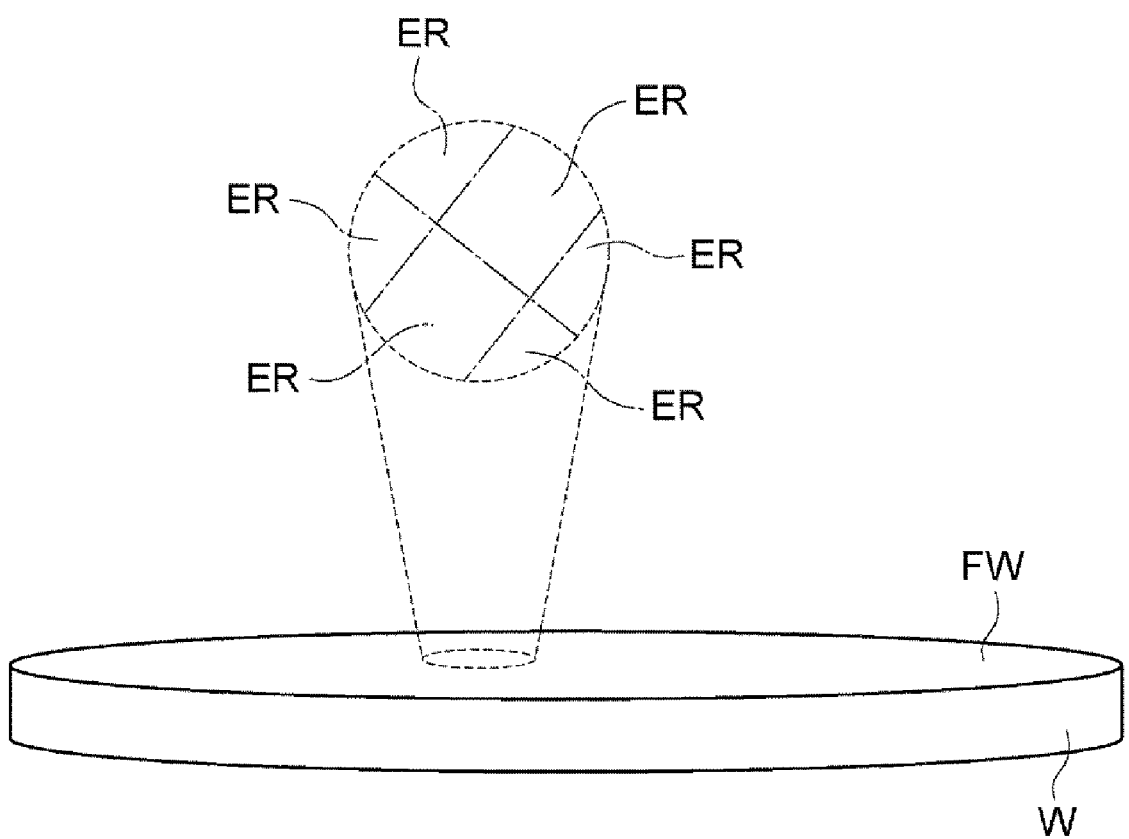
FIG. 3 is a diagram schematically illustrating an example of a part of multiple regions of a main surface of the target object in the method of processing the target object according to the exemplary embodiment.

The temperature control unit HT is equipped with a plurality of heating elements each configured to generate heat; and a plurality of temperature sensors respectively configured to detect temperatures around the plurality of heating elements. As depicted in FIG. 3, each of the plurality of heating elements is arranged to correspond to each corresponding one of multiple regions ER of the main surface FW of the wafer W when the wafer W is position-aligned on the electrostatic chuck ESC. When the wafer W is position-aligned on the electrostatic chuck ESC, a control unit Cnt recognizes the heating element and the temperature sensor corresponding to each of the multiple regions ER of the main surface FW of the wafer W in relation with the corresponding region ER. For each of the plurality of regions (regions ER), the control unit Cnt is capable of identifying the region ER; and the heating element and the temperature sensor corresponding to the region ER based on a notation such as a number or a character. The control unit Cnt detects a temperature of each region ER by the temperature sensor provided at a position corresponding to the region ER and controls the temperature of the region ER by the heating element provided at the position corresponding to the region ER. Further, when the wafer W is placed on the electrostatic chuck ESC, a temperature detected by a single temperature sensor is equal to a temperature of the region ER of the wafer W where the corresponding temperature sensor is provided, and, referring to FIG. 4A, is equal to a temperature of the corresponding region ER on the main surface FW of the wafer W and, more specifically, equal to a temperature of the mask MK and the etching target layer EL on the corresponding region ER.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other and serve as parallel plate electrodes. Formed between the upper electrode 30 and the lower electrode LE is the processing space Sp in which a plasma processing is performed on the wafer W.

The upper electrode 30 is supported at an upper portion of the processing vessel 12 with an insulating shield member 32 therebetween. The insulating shield member 32 is made of an insulating material, such as quartz, containing oxygen. The upper electrode 30 may include an electrode plate 34 and an electrode supporting body 36. The electrode plate 34 faces the processing space Sp, and is provided with a multiple number of gas discharge holes 34a. In the exemplary embodiment, the electrode plate 34 contains silicon. In another exemplary embodiment, the electrode plate 34 may contain silicon oxide.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. A multiple number of gas through holes 36b are extended downwards from the gas diffusion space 36a, and these gas through holes 36b respectively communicate with the gas discharge holes 34a.

The plasma processing apparatus 10 further includes a first high frequency power supply 62 and a second high frequency power supply 64. The first high frequency power supply 62 is configured to generate a first high frequency power for plasma generation having a frequency ranging from 27 MHz to 100 MHz, e.g., 60 MHz. Further, the first high frequency power supply 62 has a pulse specification and is controllable within a frequency ranging from 0.1 kHz to 50 kHz and a duty ranging from 5% to 100%. The first high frequency power supply 62 is connected to the upper electrode 30 via a matching device 66. The matching device 66 is a circuit configured to match an output impedance of the first high frequency power supply 62 and an input impedance at a load side (lower electrode LE). Alternatively, the first high frequency power supply 62 may be connected to the lower electrode LE via the matching device 66.

The second high frequency power supply 64 is configured to generate a second high frequency power for ion attraction into the wafer W, i.e., a high frequency bias power having a frequency ranging from 400 kHz to 40.68 MHz. As an example, the second high frequency power supply 64 generates the high frequency bias power having a frequency of 13.56 MHz. Further, the second high frequency power supply 64 has a pulse specification and is controllable within a frequency ranging from 0.1 kHz to 50 kHz and within a duty ranging from 5% to 100%. The second high frequency power supply 64 is connected to the lower electrode LE via a matching device 68. The matching device 68 is a circuit configured to match an output impedance of the second high frequency power supply 64 and the input impedance at the load side (lower electrode LE).

The plasma processing apparatus 10 further includes a power supply 70. The power supply 70 is connected to the upper electrode 30. The power supply 70 is configured to apply, to the upper electrode 30, a voltage for attracting positive ions existing in the processing space Sp into the electrode plate 34. As an example, the power supply 70 is a DC power supply configured to generate a negative DC voltage. If such a voltage is applied from the power supply 70 to the upper electrode 30, the positive ions existing in the processing space Sp collide with the electrode plate 34. Accordingly, secondary electrons and/or silicon may be released from the electrode plate 34.

At the bottom portion of the processing vessel 12, a gas exhaust plate 48 is provided between the supporting member 14 and a sidewall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 has a vacuum pump such as a turbo molecular pump, and is capable of decompressing the space within the processing vessel 12 to a required vacuum degree. A carry-in/out opening 12g for the wafer W is provided at the sidewall of the processing vessel 12, and the carry-in/out opening 12g is opened/closed by a gate valve 54.

A gas source group 40 includes a plurality of gas sources. The plurality of gas sources may include gas sources of various kinds of gases such as a source of an organic-containing aminosilane-based gas, a source of a fluorocarbon-based gas ($C_xF_y$ gas (x and y denote an integer ranging from 1 to 10), a source of a gas (oxygen gas, etc.) having an oxygen atom and a source of an inert gas. As the organic-containing aminosilane-based gas, a gas having a molecular structure with a relatively small number of amino groups may be used. By way of non-limiting example, monoaminosilane ($H_3$—Si—R (R denotes an amino group which contains an organic and may be substituted)) may be used. The aforementioned organic-containing aminosilane-based gas (which is contained in a second gas G1 to be described later) may include aminosilane having one to three silicon atoms or aminosilane having one to three amino groups. The aminosilane having the one to three silicon atoms may be monosilane (monoaminosilane) having one to three amino groups, disilane having one to three amino groups, or trisilane having one to three amino groups. Further, the aforementioned aminosilane may have an amino group which may be substituted. The amino group may be substituted with any one of a methyl group, an ethyl group, a propyl group or a butyl group. Furthermore, the aforementioned methyl group, the ethyl group, the propyl group or the butyl group may be substituted with a halogen. The fluorocarbon-based gas (a gas which is contained in a first gas to be described later) may be implemented by, by way of example, but not limitation, a $CF_4$ gas, a $C_4F_6$ gas, a $C_4F_8$ gas, or the like. Further, the inert gas may be implemented by a nitrogen gas, an Ar gas, a He gas, or the like.

The valve group 42 includes a plurality of valves, and the flow rate control unit group 44 includes a plurality of flow rate controllers such as mass flow controllers. Each of the gas sources belonging to the gas source group 40 is connected to a gas supply line 38 and a gas supply line 82 via a corresponding valve of the valve group 42 and a corresponding flow rate controller of the flow rate controller group 44. Accordingly, the plasma processing apparatus 10 is capable of supplying a gas from one or more gas sources selected from the gas sources belonging to the gas source group 40 into the processing vessel 12 at an individually controlled flow rate.

Since the organic-containing aminosilane-based gas is supplied in the plasma processing apparatus 10 as will be described later, the plasma processing apparatus 10 has a post mix structure in which a pipeline for supplying the organic-containing aminosilane-based gas and a pipeline for supplying another processing gas (e.g., an oxygen gas) are separated. Since the organic-containing aminosilane-based gas has high reactivity, if the supply of the organic-containing aminosilane-based gas and the supply of the other processing gas are performed through a same pipeline, a component of the organic-containing aminosilane-based gas adhering to the inside of the pipeline may react with a component of the another processing gas, so that a reaction product generated by this reaction may be deposited within the pipeline. The reaction product deposited in the pipeline is difficult to remove by cleaning or the like, which may cause particle generation and an abnormal discharge if the pipeline is located close to a plasma region. Thus, the supply of the organic-containing aminosilane-based gas and the supply of the another processing gas may need to be separately performed through individual pipelines. In the post mix structure of the plasma processing apparatus 10, the organic-containing aminosilane-based gas and the another processing gas are supplied through the separate pipelines.

The post mix structure of the plasma processing apparatus 10 includes at least two pipelines (the gas supply line 38 and the gas supply line 82). The gas supply line 38 and the gas supply line 82 are connected with the gas source group 40 via the valve group 42 and the flow rate controller group 44.

The processing vessel 12 is provided with a gas inlet opening 36c (first gas inlet opening). Within the processing vessel 12, the gas inlet opening 36c is provided above the wafer W placed on the mounting table PD. The gas inlet opening 36c is connected to one end of the gas supply line 38. The other end of the gas supply line 38 is connected to the valve group 42. The gas inlet opening 36c is provided at the electrode supporting body 36. Through the gas inlet opening 36c, the first gas (containing the fluorocarbon-based gas) to be described later, a backflow prevention gas (containing the inert gas or the like) to be described later, a third gas (containing an oxygen atom) to be described later and a purge gas (containing the inert gas or the like) to be described later are introduced into the gas diffusion space 36a. The gases introduced into the processing space Sp from the gas inlet opening 36c through the gas diffusion space 36a are supplied into a space above the wafer W and between the wafer W and the upper electrode 30.

The processing vessel 12 is provided with a gas inlet opening 52a (second gas inlet opening). Within the processing vessel 12, the gas inlet opening 52a is provided at a lateral side of the wafer W placed on the mounting table PD. The gas inlet opening 52a is connected to one end of the gas supply line 82. The other end of the gas supply line 82 is connected to the valve group 42. The gas inlet opening 52a is provided at the sidewall of the processing vessel 12. Through the gas inlet opening 52a, a second gas G1 (containing the organic-containing aminosilane-based gas) to be described later and the backflow prevention gas (containing the inert gas or the like) are introduced into the processing space Sp. The gases introduced into the processing space Sp from the gas into opening 52a are supplied into the space above the wafer W and between the wafer W and the upper electrode 30.

The gas supply line 38 connected to the gas inlet opening 36c and the gas supply line 82 connected to the gas inlet opening 52a are not intersected with each other. That is, a supply path of the first gas and the third gas including the gas inlet opening 36c and the gas supply line 38 and a supply path of the second gas G1 including the gas inlet opening 52a and the gas supply line 82 are not intersected with each other.

In the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramic such as $Y_2O_3$ or the like. Besides the $Y_2O_3$, the deposition shield may be made of an oxygen-containing material such as, but not limited to, quartz.

The control unit Cnt is implemented by a computer including a processor, a storage unit, an input device, a display device, and so forth, and is configured to control individual components of the plasma processing apparatus 10 shown in FIG. 2. To elaborate, in the plasma processing apparatus 10, the control unit Cnt is connected to the valve group 42, the flow rate controller group 44, the gas exhaust device 50, the first high frequency power supply 62, the matching device 66, the second high frequency power supply 64, the matching device 68, the power supply 70, the heater power supply HP, the chiller unit, and so forth.

The control unit Cnt is operated to output control signals according to a computer program (a program based on an input recipe) for controlling the individual components of the plasma processing apparatus 10 in the respective processes of the method MT. The individual components of the plasma processing apparatus 10 are controlled in response to the control signals from the control unit Cnt. To elaborate, in the plasma processing apparatus 10 shown in FIG. 2, the selection of the gas supplied from the gas source group 40 and a flow rate of the selected gas, the gas exhaust of the gas exhaust device 50, the power supplies from the first and second high frequency power supplies 62 and 64, the voltage application from the power supply 70, the power supply of the heater power supply HP, the control of the flow rate and the temperature of the coolant from the chiller unit can be carried out in response to the control signals from the control unit Cnt. Further, the individual processes of the method MT of processing the target object according to the present exemplary embodiment can be performed by operating the individual components of the plasma processing apparatus 10 under the control of the control unit Cnt. The computer program for implementing the method MT and various kinds of data used in performing the method MT are stored in the storage unit of the control unit Cnt in a retrievable manner.

Figure 6A:
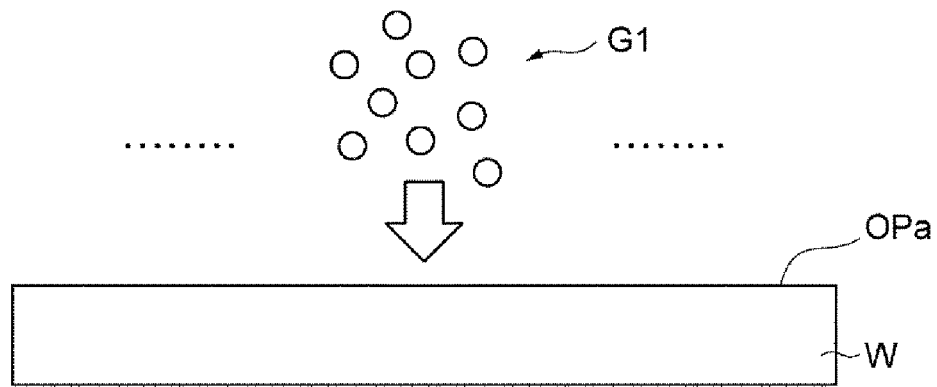
FIG. 6A is a diagram schematically illustrating a state of the target object obtained before the sequence shown in FIG. 1 is performed.
Figure 6B:
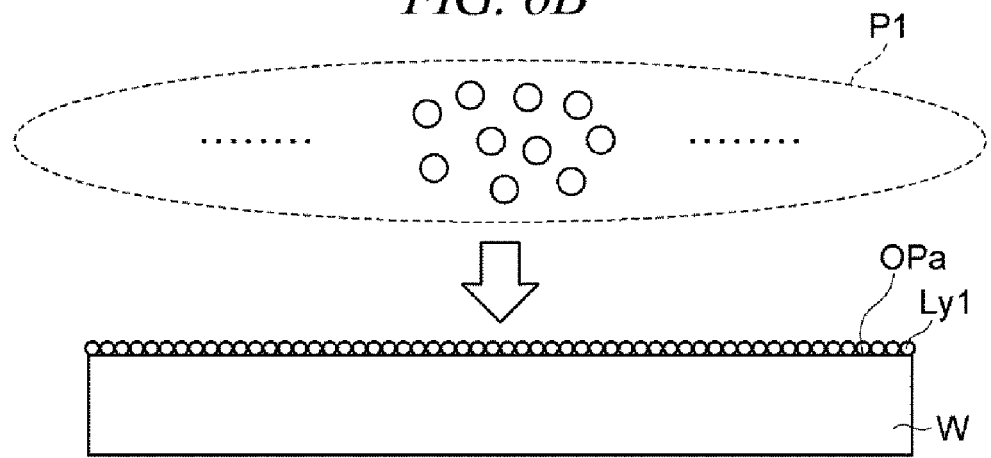
FIG. 6B is a diagram schematically illustrating a state of the target object obtained while the sequence shown in FIG. 1 is being performed.

Referring back to FIG. 1, the method MT will be discussed in detail. In the following, an example where the plasma processing apparatus 10 is used to perform the method MT will be explained. In the following description, reference is made to FIG. 4A to FIG. 6C. FIG. 4A is a cross sectional view illustrating a state of a target object obtained before processes shown in FIG. 1 are performed; FIG. 4B, a cross sectional view illustrating a state of the target object obtained after etching shown in FIG. 1 is performed; and FIG. 4C, a cross sectional view illustrating a state of the target object obtained after a sequence shown in FIG. 1 is performed multiple times. FIG. 5 is a diagram illustrating states of the supply of the gases and the supply of the high frequency powers in the individual processes of the method MT shown in FIG. 1. FIG. 6A is a diagram schematically illustrating a state of the target object obtained before the sequence shown in FIG. 1, for example, is performed; FIG. 6B, a diagram schematically illustrating a state of the target object obtained while the sequence shown in FIG. 1 is being performed; and FIG. 6C, a diagram schematically illustrating a state of the target object obtained after the sequence shown in FIG. 1 is performed.

As depicted in FIG. 1, the method MT includes a process ST1, a sequence SQ1 and a process ST3. Prior to performing the process ST1 of the method MT, a wafer W as the target object is prepared. The prepared wafer W has, as illustrated in FIG. 4A, an etching target layer EL and a mask MK. The mask MK is provided on a main surface ELa of the etching target layer EL. The mask MK is provided with an opening OP which reaches the main surface ELa of the etching target layer EL. The opening OP may be a recess, a hole, or the like. The main surface ELa of the etching target layer EL is partially exposed through the opening OP. The mask MK has a side surface MKa and a front surface MKb. The side surface MKa is included in an inner surface OPa of the opening OP. The front surface MKb is included in a main surface FW of the wafer W.

The etching target layer EL is made of a material selectively etched against the mask MK. For example, a hydrophilic insulating layer containing silicon may be used as the etching target layer EL. To be more specific, the etching target layer EL may contain, by way of non-limiting example, silicon oxide ($SiO_2$). The etching target layer EL may contain other materials such as silicon nitride $Si_3N_4$ or polycrystalline silicon.

The mask MK is provided on the main surface ELa of the etching target layer EL. The mask MK is implemented by a resist mask containing a resist material such as ArF and is formed by patterning a resist layer through a photolithography technique. The mask MK partially covers the main surface ELa of the etching target layer EL. The opening OP defines a pattern shape of the mask MK. The pattern shape of the mask MK is, by way of example, but not limitation, a line-and-space pattern. Further, the mask MK may have a pattern which provides a circular opening when viewed from the top. Alternatively, the mask MK may have a pattern which provides an elliptical opening when viewed from the top.

Prior to performing the process ST1, the wafer W shown in FIG. 4A is prepared, and the wafer W is accommodated within the processing vessel 12 of the plasma processing apparatus 10 and placed on the mounting table PD while being position-aligned thereon. While the method MT shown in FIG. 1 is being performed (at least while a process ST2a included in the method MT is being performed), the control unit Cnt detect a temperature of each of the multiple regions ER of the wafer W by the temperature sensor of the temperature control unit HT provided at a position corresponding to the region ER, and adjust the temperature of the region ER by the heating element of the temperature control unit HT provided at the position corresponding to the region ER. As the control unit Cnt performs this temperature control by using the temperature control unit HT, the temperature of the wafer W can be uniformed across the multiple regions ER.

In the process ST1, the etching target layer EL of the wafer W shown in FIG. 4A is etched. In the process ST1, the etching target layer EL is anisotropically etched through the opening OP. In the process ST1, plasma of the first gas is generated within the processing space Sp of the processing vessel 12 of the plasma processing apparatus 10 in which the wafer W is accommodated. In the process ST1, from a gas source selected from the gas sources belonging to the gas source group 40, the first gas is supplied into the processing space Sp of the processing vessel 12 from the gas inlet opening 36c through the gas supply line 38, as indicated by a notation FG1 of FIG. 5. At the same time, the backflow prevention gas is supplied into the processing space Sp of the processing vessel 12 from the gas inlet opening 52a through the gas supply line 82, as indicated by a notation FG2 of FIG. 5. The first gas may be selected depending on the material forming the etching target layer EL. The first gas contains a carbon atom and a fluorine atom. By way of example, in case that the etching target layer EL is a silicon oxide film, the processing gas may contain a fluorocarbon-based gas. The backflow prevention gas is supplied into the processing space Sp from the gas inlet opening 52a to suppress the first gas supplied into the processing space Sp and plasma ions of the first gas from being introduced into the gas supply line 82 through the gas inlet opening 52a. The backflow prevention gas may contain, by way of example, but not limitation, an inert gas. Further, the high frequency power is supplied from the first high frequency power supply 62, as indicated by a notation FG3 of FIG. 5. Further, the high frequency bias power is supplied from the second high frequency power supply 64, as indicated by a notation FG4 of FIG. 5. Further, by operating the gas exhaust device 50, a pressure within the processing space Sp is set to a preset pressure. As a result, plasma is generated. Active species in the generated plasma etch the region of the main surface ELa of the etching target layer EL exposed through the opening OP of the mask MK. Through the process ST1, the pattern (the pattern formed by the opening OP) of the mask MK is transcribed to the etching target layer EL, as illustrated in FIG. 4B.

Through the etching performed in the process ST1, the etching target layer EL is etched, and an inner side of the opening OP reaches the inside of the etching target layer EL. As shown in FIG. 4B, in the etching performed in the process ST1, the reaction product containing the component included in the first gas is deposited on certain portions of the front surface MKb of the mask MK and the side surface MKa of the mask MK corresponding to the opening OP, and by this deposition, a deposit NC, which is the reaction product, is attached to the opening OP. That is, there occurs necking in which the opening OP is clogged due to the deposition of the reaction product (adhesion of the deposit NC). The plasma ions generated in the process ST1 are incident upon the wafer W vertically (anisotropically) with respect to the main surface FW of the wafer W. If the deposit NC is attached, however, the plasma ions are incident on the deposit NC to be collided with the deposit NC, so that a travel direction of the plasma ions is bent and anisotropy of the plasma ions disappears. Accordingly, the plasma ions collide with the inner surface OPa of the opening OP, so that the inner surface OPa of the opening OP becomes to have a bowing shape. Here, the inner surface OPa of the opening OP includes: of the inner side surface of the opening OP, the side surface MKa of the mask MK; of the inner side surface of the opening OP, a side surface ELb of the etching target layer EL; and, of an inner bottom surface of the opening OP, a bottom surface ELc within the etching target layer EL (the same in the following description).

To perform a removal of the deposit NC attached to the opening OP in the process ST1 and a supplement of the bowing shape formed on the inner surface OPa of the opening OP in the process ST1, the sequence SQ1 and the process ST3 following the process ST1 are performed multiple times. The sequence SQ1 and the process ST3 are a process of forming a film BF on the inner surface OPa of the opening OP after the process ST1 of etching the etching target layer EL is performed.

After the process ST1, the sequence SQ1 is performed. The sequence SQ1 includes a process ST2a (first process), a process ST2b (second process), a process ST2c (third process) and a process ST2d (fourth process). In the method MT, the sequence SQ1 is repeated multiple times. As the sequence SQ1 is repeated multiple times through the sequence SQ1 and the process ST3, the film BF is formed on the inner surface OPa of the opening OP. A series of processes from the start of the sequence SQ1 to the process ST3 (YES) to be described later are a process of concurrently performing the removal of the deposit NC attached to the opening OP in the process ST1 and the supplement of the bowing shape formed on the side surface MKa and the side surface ELb, and repairing a shape within the opening OP, more specifically, a shape of the inner surface OPa of the opening OP into a required shape. The supplement of the bowing shape formed on the side surface MKa and the side surface ELb is achieved by forming the film BF on a portion of the bowing shape formed on the inner surface OPa of the opening OP. The film BF is a silicon oxide film containing silicon oxide ($SiO_2$).

In the process ST2a, the second gas G1 from the gas supply line 82 is supplied into the processing space Sp of the processing vessel 12 through the gas inlet opening 52a, as indicated by a notation FG2 of FIG. 5, and the backflow prevention gas from the gas supply line 38 is supplied into the processing space Sp of the processing vessel 12 through the gas inlet opening 36c, as indicated by a notation FG1 of FIG. 5. The second gas G1 includes the organic-containing aminosilane-based gas. In the process ST2a, the second gas G1 is supplied into the processing space Sp of the processing vessel 12 from a gas source selected from the gas sources belonging to the gas source group 40. By way of non-limiting example, the organic-containing aminosilane-based gas such as monoaminosilane ($H_3$—Si—R (R denotes an amino group)) may be used as the second gas G1. In the process ST2a, plasma of the second gas G1 is not generated, as indicated by notations FG3 and FG4 of FIG. 5. Molecules (monoaminosilane) of the second gas G1 adhere to the inner surface OPa of the opening OP (specifically, a portion of the inner surface OPa where the deposit NC is not attached) by chemical adsorption caused by chemical bond, and plasma is not used in the process ST2a. Furthermore, the second gas G1 may be any of various other gases, besides the monoaminosilane, as long as molecules thereof can be attached to the inner surface OPa (to be specific, the portion of the surface OPa where the deposit NC is not attached) by chemical bond and contains silicon. The backflow prevention gas is supplied into the processing space Sp from the gas inlet opening 36c to suppress the second gas G1 supplied into the processing space Sp from being introduced into the gas supply line 38 through the gas inlet opening 36c. The backflow prevention gas may include, by way of non-limiting example, an inert gas.

The reason why the monoaminosilane-based gas is selected as the second gas G1 is because the chemical adsorption can be carried out relatively easily since the monoaminosilane has a molecular structure having a relatively high electro-negativity and polarity. As shown in FIG. 6A and FIG. 6B, a layer Ly1, which is formed as the molecules of the second gas G1 are attached to the inner surface OPa of the opening OP (specifically, a portion of the inner surface OPa which is exposed and on which no deposit NC is attached, the same for the surface OPa shown in FIG. 6A to FIG. 6C), becomes to have a state close a monomolecular layer (monolayer) since the corresponding attachment is made by the chemical adsorption. The smaller the amino group R of the monoaminosilane is, the smaller the molecular structure of the molecules adsorbed to the inner surface OPa of the opening OP is, so that steric hindrance which relies on the size of molecules is reduced. As a result, the molecules of the second gas G1 can be uniformly adsorbed onto the inner surface OPa of the opening OP, so that the layer Ly1 can be formed to have a uniform thickness across the inner surface OPa of the opening OP. By way of example, as the monoaminosilane ($H_3$—Si—R) contained in the second gas G1 reacts with a hydrophilic OH group of the inner surface OPa of the opening OP, $H_3$—Si—O as a reaction precursor is generated, so that the layer Ly1 made up of a monomolecular layer of $H_3$—Si—O may be formed. Accordingly, the layer Ly1 of the reaction precursor can be conformally formed on the inner surface OPa of the opening OP. Further, since the deposit NC adhering to the opening OP includes a hydrophobic compound containing a carbon atom and a fluorine atom, the layer Ly1 is not formed on the deposit NC. However, as will be described later, the deposit NC is physically removed by performing the sequence SQ1 multiple times, and the layer Ly1 may be formed on the inner surface OPa of the opening OP which is exposed after the deposit NC is removed.

Furthermore, the aminosilane-based gas contained in the second gas G1 may include, other than the monoaminosilane, aminosilane having one to three silicon atoms. Alternatively, the aminosilane-based gas contained in the second gas G1 may include aminosilane having one to three amino groups.

In the process ST2a, the etching target layer EL is etched through the opening OP while the temperature of the wafer W is controlled to be uniform across the multiple regions ER of the wafer W. That is, while the process ST2a is being performed, the control unit Cnt continuously performs the temperature control upon the wafer W by using the temperature control unit HT such that the temperature of the wafer W (particularly, the mask MK and the etching target layer EL of the wafer W) is uniformed across the multiple regions ER. The degree of the chemical adhesion (chemical adsorption) of the molecules (e.g., monoaminosilane) of the second gas G1 to the hydrophilic inner surface OPa of the opening OP depends on the temperature of the inner surface OPa. To elaborate, in case that the molecules (e.g., monoaminosilane) of the second gas G1 are chemically adsorbed to the hydrophilic inner surface OPa of the opening OP, a reaction rate of the chemical adsorption is increased with a rise of the temperature of the surface OPa, as indicated by Arrhenius Equation which shows a correlation between a reaction rate of the chemical reaction and the temperature, so that the number of the molecules of the second gas G1 chemically adsorbed to the corresponding inner surface OPa is increased. Thus, as the temperature of the inner surface OPa is increased, a film thickness of a layer Ly2 formed on the corresponding inner surface OPa is increased, and a film thickness of the film BF formed on the corresponding inner surface OPa is also increased by performing the sequence SQ1 multiple number of times. Thus, to form the film BF having a uniform thickness across the multiple regions ER of the wafer W, it is required to perform, at least while the second process ST2a is being performed, the temperature control upon the wafer W (particularly, the mask MK and the etching target layer EL of the wafer W) continuously such that the temperature of the wafer W (particularly, the mask MK and the etching target layer EL of the wafer W) is uniformed across the entire multiple regions ER.

In the process ST2b following the process ST2a, the processing space Sp of the processing vessel 12 is purged. To elaborate, the second gas G1 supplied in the process ST2a is exhausted. By way of example, in the process ST2b, an inert gas such as a nitrogen gas may be supplied into the processing space Sp of the processing vessel 12 through the gas supply line 38 and the gas inlet opening 36c as a purge gas. That is, the purging in the process ST2b may be implemented by a gas purging of allowing the inert gas to flow in the processing space Sp or a purging by vacuum evacuation. In the process ST2b, molecules excessively adhering to the inner surface OPa of the opening OP may be removed. Through the processes as stated above, the layer Ly1 of the reaction precursor is formed to be a very thin monomolecular layer.

In the process ST2c following the process ST2b, plasma P1 of the third gas is generated within the processing vessel 12. In the process ST2c, from a gas source selected from the gas sources belonging to the gas source group 40, the third gas containing the oxygen atom is supplied into the processing space Sp of the processing vessel 12 from the gas inlet opening 36c through the gas supply line 38, as indicated by the notation FG1 of FIG. 5. At the same time, the backflow prevention gas is supplied into the processing space Sp of the processing vessel 12 from the gas inlet opening 52a through the gas supply line 82, as indicated by the notation FG2 of FIG. 5. The third gas is a gas containing the oxygen atom and may be, by way of example, but not limitation, an oxygen gas. The backflow prevention gas is supplied into the processing space Sp from the gas inlet opening 52a to suppress the third gas supplied in the processing space Sp from being introduced into the gas supply line 82 through the gas inlet opening 52a. The backflow prevention gas may include, by way of example, an inert gas. Further, as indicated by the notation FG3 of FIG. 5, the high frequency power is supplied from the first high frequency power supply 62. In this case, the high frequency bias power from the second high frequency power supply 64 may also be applied, as indicated by the notation FG4 of FIG. 5. Furthermore, it may also be possible to generate the plasma by using only the second high frequency power supply 64 without using the first high frequency power supply 62. By operating the gas exhaust device 50, the pressure of the space within the processing space Sp is set to a preset pressure.

Figure 6C:
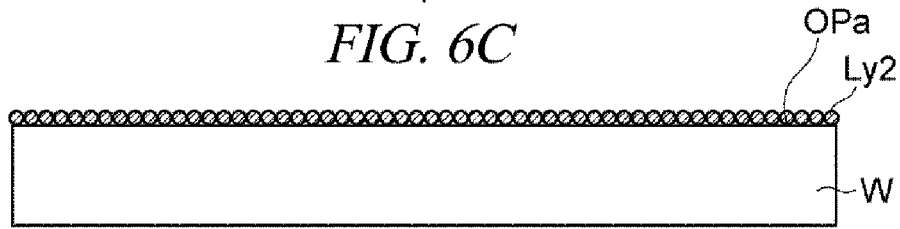
FIG. 6C is a diagram schematically illustrating a state of the target object obtained after the sequence shown in FIG. 1 is performed.

As stated above, the molecules (molecules constituting the monomolecular layer of the layer Ly1) adhering to the inner surface OPa of the opening OP through the process ST2a includes a bond between silicon and hydrogen. A binding energy of silicon and hydrogen is lower than that of silicon and oxygen. Accordingly, as illustrated in FIG. 6B, if the plasma P1 of the third gas containing the oxygen atom is generated, active species of the oxygen, for example, oxygen radicals are generated, and the hydrogen of the molecules constituting the monomolecular layer of the layer Ly1 is substituted with the oxygen, so that the layer Ly2 of silicon oxide film (for example, a $SiO_2$ film) is formed as a monomolecular layer, as illustrated in FIG. 6C.

In the process ST2d following the process ST2c, the processing space Sp of the processing vessel 12 is purged. To elaborate, the third gas supplied in the process ST2c is exhausted. In the process ST2d, an inert gas such as a nitrogen gas may be supplied into the processing space Sp through the gas supply line 38 and the gas inlet opening 36c as a purge gas. That is, the purging of the process ST2d may be implemented by the gas purging of allowing the inert gas to flow in the processing space Sp or the purging by vacuum evacuation.

In the above-described sequence SQ1, the purging is performed in the process ST2b, and the hydrogen of the molecules constituting the layer Ly1 is substituted with the oxygen in the process ST2c following the process ST2b. Accordingly, the same as in an atomic layer deposition (ALD) method, by performing the single cycle of the sequence SQ1, the layer Ly2 of the silicon oxide film can be conformally formed in a thin uniform film thickness on the portion (including the bowing-shaped portion) of the inner surface OPa of the opening OP where no deposit NC is attached. In the present specification, the ALD refers to a deposition formed by atomic layer.

Since the deposit NC contains the hydrophobic compound having the carbon atom and the fluorine atom, the layer Ly1 is not formed on the deposit NC. Single or multiple atomic layers of the deposit NC are removed from a surface of the deposit NC through the single cycle of the sequence SQl.

In the process ST3 following the sequence SQ1, it is determined whether or not to end the repetition of the sequence SQl. To elaborate, in the process ST3, it is determined whether the repetition number of the sequence SQ1 has reached a predetermined number. Determining the repetition number of the sequence SQ1 is determining a thickness of the film BF shown in FIG. 4C. To be more specific, the thickness of the film BF, which is formed on the portion (including the bowing-shaped portion) of the inner surface OPa of the opening OP where no deposit NC is attached, is determined by a product of the film thickness of the silicon oxide film (layer Ly2) formed through the single cycle of the sequence SQ1 and the repetition number of the sequence SQl. Accordingly, the repetition number of the sequence SQ1 is set based on the required thickness of the film BF formed on the portion (including the bowing-shaped portion) of the inner surface OPa of the opening OP where no deposit NC is attached.

On a portion of the inner surface OPa of the opening OP where the deposit NC is attached, the film BF is formed only by performing the sequence SQ1 after the side surface MKa and the side surface ELb are exposed by removing the deposit NC through the first cycle of the sequence SQ1 performed after the process ST1 or through multiple cycles of the sequence SQ1 including the corresponding first cycle. If the deposit NC having the hydrophobic surface (containing the compound having the carbon atom and the fluorine atom) is removed through the first cycle of the sequence SQ1 performed after the process ST1 or through the multiple cycles of the sequence SQ1 including the corresponding first cycle, the side surface MKa and the side surface ELb, which are hydrophilic surfaces having the OH group, are exposed. Then, the monoaminosilane ($H_3$—Si—R) contained in the second gas G1 reacts with the hydrophilic OH group in the inner surface OPa of the opening OP through the process ST2a of the sequence SQ1 performed after the deposit NC is removed, so that the reaction precursor of the $H_3$—Si—O is generated and the layer Ly1 as the monomolecular layer of the $H_3$—Si—O is formed. The a repetition number of the sequence SQ1 until the film BF is formed on the portion of the inner surface OPa of the opening OP where the deposit NC is attached is smaller than the total repetition number of the sequence SQL As a result, the film thickness of the film BF formed on the portion of the inner surface OPa of the opening OP where the deposit NC is attached is smaller than the film thickness of the film BF formed on the portion (including the bowing-shaped portion) of the inner surface OPa of the opening OP where no deposit NC is attached.

If it is determined in the process ST3 that the repetition number of the sequence SQ1 has not reached the predetermined number (process ST3: NO), the sequence SQ1 is repeated. Meanwhile, if it is determined in the process ST3 that the repetition number of the sequence SQ1 has reached the predetermined number (process ST3: YES), the repetition of the sequence SQ1 is finished. As the sequence SQ1 is repeated the predetermined number of times (process ST3: YES), the deposit NC is removed, and the film BF of the silicon oxide film is formed on the inner surface OPa of the opening OP, as illustrated in FIG. 4C.

The film BF, which is formed on the portion of the inner surface OPa of the opening OP where no deposit NC is attached, is mainly formed on the bowing-shaped portion (recess within the opening OP) of the inner surface OPa of the opening OP. The film thickness of the film BF formed on the portion (including the bowing-shaped portion) of the inner surface OPa of the opening OP where no deposit NC is attached is larger than the film thickness of the film BF formed on the portion of the inner surface OPa of the opening OP where the deposit NC is attached. Accordingly, by repeating the sequence SQ1 until it is determined in the process ST3 that the repetition number of the sequence SQ1 has reached the predetermined number, the bowing shape is supplemented by the film BF, and the deposit NC attached to the opening OP is removed. Thus, through the method MT, the flatness of the inner surface OPa of the opening OP can be sufficiently recovered.

The method MT includes a sequence SQ2 and a process ST4. The sequence SQ2 includes the aforementioned process ST1, the sequence SQ1 and the process ST3. In the method MT, the sequence SQ2 is performed one or more times. In the process ST4 following the sequence SQ2 (continued from the process ST3: YES), it is determined whether or not to finish the repetition of the sequence SQ2. To be specific, it is determined in the process ST4 that the repetition number of the sequence SQ2 has reached the predetermined number. If it is determined in the process ST4 that the repetition number of the sequence SQ2 has not reached the predetermined number (process ST4: NO), the sequence SQ2 is repeated. Meanwhile, if it is determined in the process ST4 that the repetition number of the sequence SQ2 has reached the predetermined number (process ST4: YES), the repetition of the sequence SQ2 is finished. As the sequence SQ2 is repeated in this way, a depth of the inside of the opening OP can be adjusted to a required depth while maintaining the flatness and the shape of the inside of the opening OP.

Through the etching performed in the process ST1, the deposit NC as the reaction product originated from the first gas may be attached to the opening OP, and the bowing shape (recess) may be formed at the portion of the inner surface OPa of the opening OP where no deposit NC is attached (where the etching target layer EL is exposed). According to the method MT of the exemplary embodiment described so far, through the sequence SQ1 and the process ST3 performed after the process ST1, the deposit NC adhering to the opening OP is removed, and the bowing shape can be reduced (improved) as the film BF is formed on the portion where the bowing shape is formed.

Furthermore, in the process ST2a using the second gas, the chemical reaction is made without generating the plasma. Thus, the thickness of the film BF formed through the sequence SQ1 including the process ST2a and the process ST3 is increased with a rise of the temperature of the wafer W (particularly, the etching target layer EL) on which the film BF is formed. Therefore, according to the method MT, the thickness of the film BF formed in the sequence SQ1 and the process ST3 can be made to be uniform across the multiple regions ER of the wafer W.

Moreover, the gas inlet opening 52a through which the second gas, which is used in the process ST2a and contains the organic-containing aminosilane-based gas having relatively high reactivity, is introduced into the processing vessel 12 and the gas inlet opening 36c through which the first gas, which is used in the process ST1 and contains the carbon atom and the fluorine atom, and the third gas, which is used in the process ST2c and contains the oxygen atom, are introduced into the processing vessel 12 are different from each other. Further, the gas supply line 38 connected to the gas inlet opening 36c and the gas supply line 82 connected to the gas inlet opening 52a are not intersected with each other. Therefore, it is possible to reduce a reaction product that might be originated from the second gas including the organic-containing aminosilane-based gas having the relatively high reactivity and the first and third gases and might be generated within the gas supply lines (the gas inlet opening 36c and the gas inlet opening 52a). Furthermore, by using the backflow prevention gas, it is possible to suppress any of the first gas, the second gas and the third gas from flowing back into the gas supply line (the gas inlet opening 36c or the gas inlet opening 52a) in which any of the first gas, the second gas and the third gas is not flowing.

Furthermore, the etching upon the etching target layer EL made of the hydrophilic insulating layer containing the silicon can be performed in the process ST1 by using the first gas containing the fluorocarbon-based gas, and the formation of the reaction precursor of the silicon can be performed in the process ST2a by using the second gas containing the monoaminosilane.

As stated above, according to the first exemplary embodiment, it is possible to reduce the bowing shape on the side surface of the recess caused by the etching.

Second Exemplary Embodiment

Figure 7:
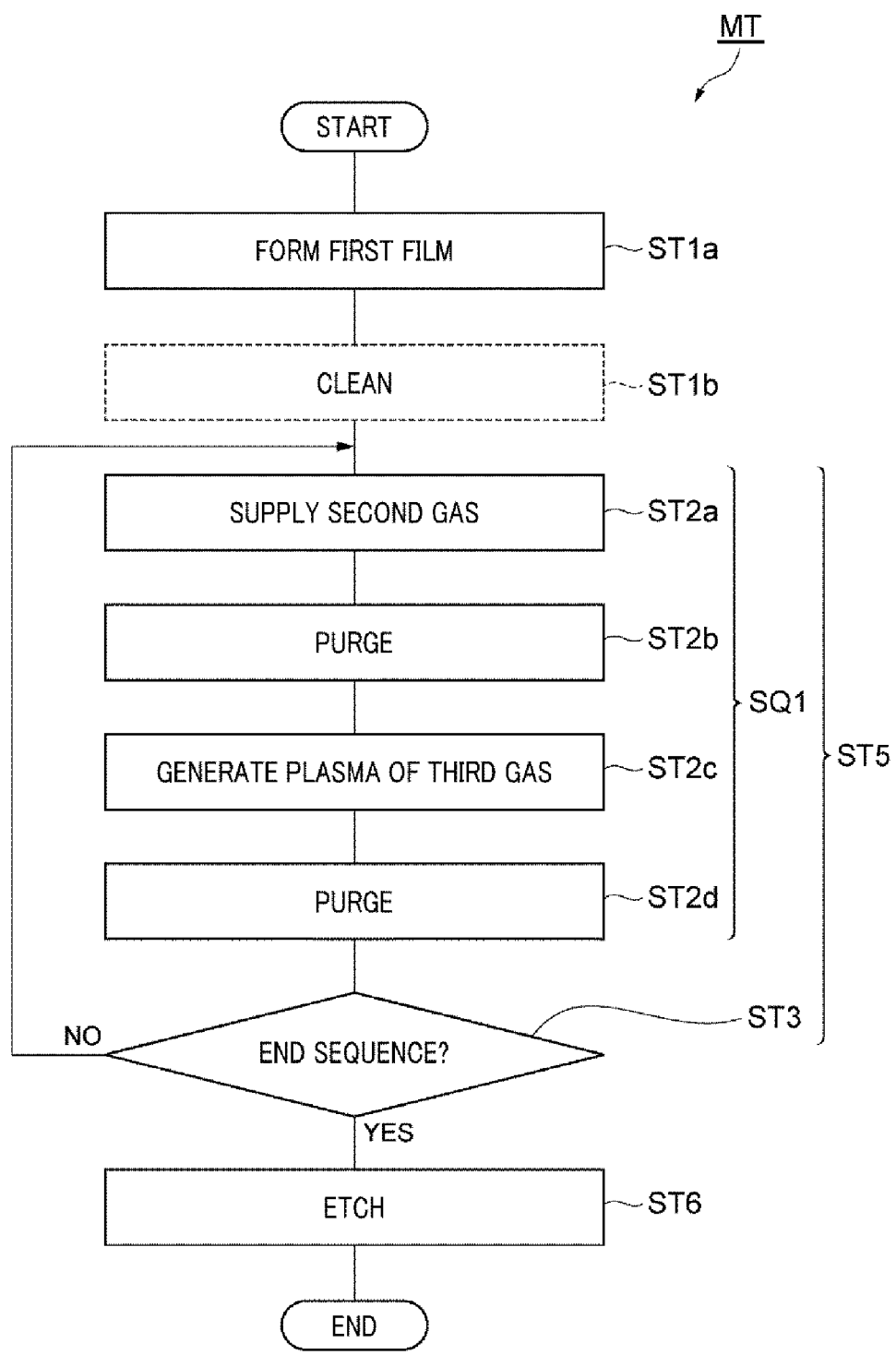
FIG. 7 is a flowchart illustrating a method of processing a target object according to another exemplary embodiment.

Now, the following description refers to FIG. 7 to FIG. 11. FIG. 7 is a flowchart illustrating a method MT of processing a wafer W according to a second exemplary embodiment. The method MT includes a process ST1a and a process ST5 which are performed in sequence. The method MT may further include a process ST1b after the process ST1a. In the second exemplary embodiment, a surface of the wafer W includes a surface SFa of a first region La of the wafer W and a surface SFb of a second region Lb of the wafer W. In this exemplary embodiment, a first film M1 is formed on the surface SFa of the first region La of the wafer W. A film is formed on the surface SFb of the second region Lb by ALD.

The control unit Cnt of the plasma processing apparatus 10 performs the method MT by controlling the individual components of the plasma processing apparatus 10.

Figure 8A:
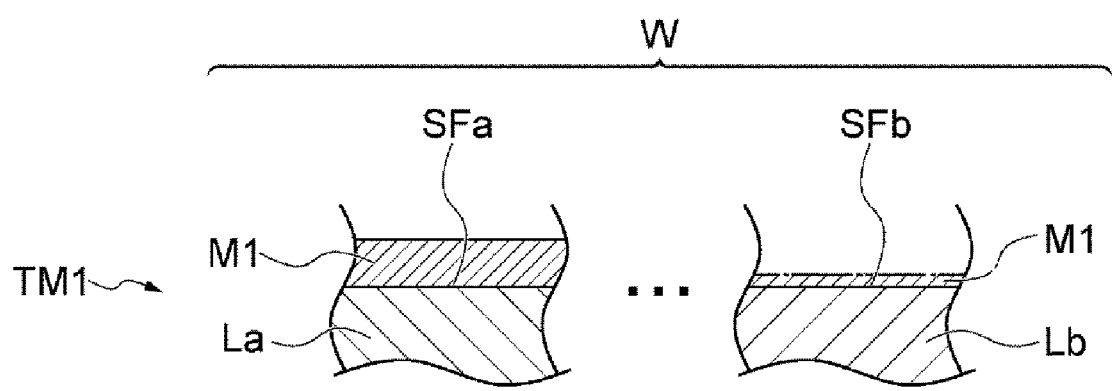
FIG. 8A and FIG. 8B are diagrams schematically illustrating a state in which a film is being formed on a surface of the target object through the method shown in the flowchart of FIG. 7.
Figure 8B:
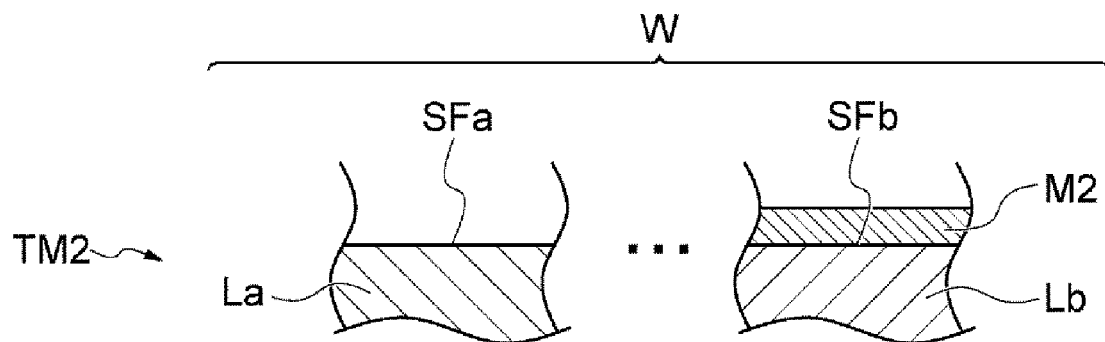

FIG. 8A and FIG. 8B are cross sectional views illustrating states of the wafer W after the individual processes of the method MT shown in FIG. 7 are performed. TM1 in FIG. 8A shows a state of the wafer at a moment when the process ST5 is begun, and TM2 in FIG. 8B shows a state of the wafer at a moment when the process ST5 is ended (particularly, removal of the first film M1 is ended) (the same in the description of FIG. 9A to FIG. 11).

Figure 11:
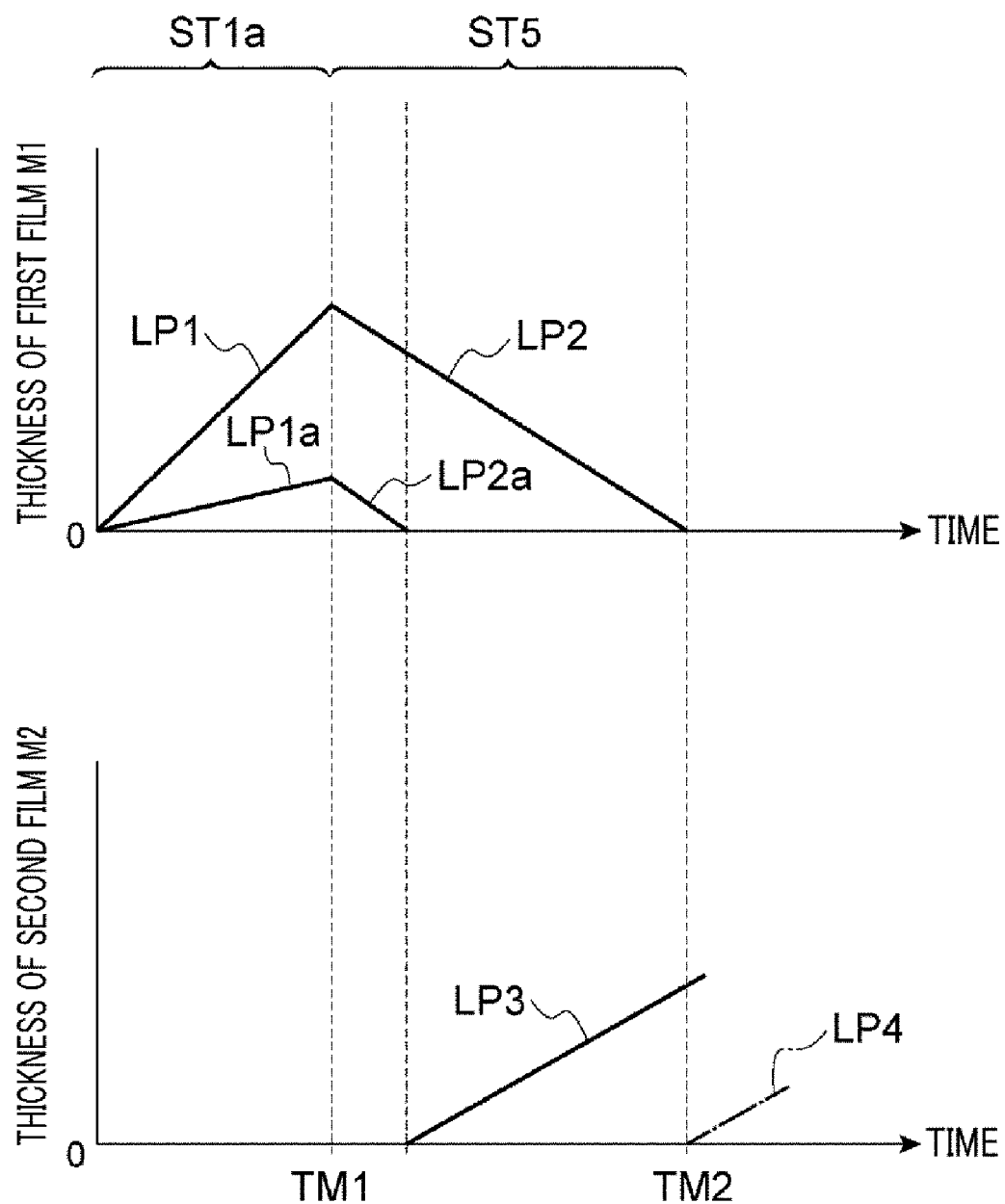
FIG. 11 is a diagram illustrating a variation in a film thickness while the method shown in the flowchart of FIG. 7 is performed.

FIG. 9A and FIG. 9B schematically illustrate the removal of the first film M1 and formation of a second film M2 according to the method MT shown in FIG. 7. FIG. 9A schematically illustrates the removal of the first film M1 and the formation of the second film M2 on the first region La. FIG. 9B schematically illustrates the formation of the second film M2 on the second region Lb. FIG. 10 shows a thickness variation of the first film M1 and a thickness variation of the second film M2 according to the method MT shown in FIG. 7. FIG. 11 shows different thickness variations according to the method MT. A vertical axis of FIG. 10 indicates the thickness of the first film M1. A vertical axis of FIG. 11 represents the thickness of the second film M2. A horizontal axis in each of FIG. 10 and FIG. 11 indicates a time elapsed from the beginning of a processing.

The method MT shown in FIG. 7 will be explained. The process ST1$a$ forms the first film M1 (FIG. 8A) selectively on the wafer W. To elaborate, in the process ST1$a$, the first film M1 is formed on the surface SFa of the first region La of the wafer W, as illustrated in FIG. 8A. Here, the first film M1 is not formed on the surface SFb of the second region Lb of the wafer W (corresponding to a case shown in FIG. 10) or is formed thereon in a thickness smaller than a thickness of the first film M1 formed on the surface SFa (corresponding to a case shown in FIG. 11). Further, the process ST1$a$ includes preparing the wafer W having the first region La made of a first material and the second region Lb made of a second material different from the first material. The first material and the second material will be described later.

In the process ST1$a$, the first film M1 is formed by using a fourth gas. The first film M1 may be formed by plasma enhanced chemical vapor deposition (PECVD) or thermal CVD using the fourth gas. As another example, the first film M1 may be formed by etching with active species of the fourth gas. If the first material of the first region La contains, for example, any of silicon, an organic material and a metal and the second material of the second region Lb contains, for example, silicon and oxygen, the fourth gas may be a fluorocarbon gas. If the first material of the first region La contains, for example, any of silicon, an organic material and a metal and the second material of the second region Lb contains, for example, silicon and nitrogen, the fourth gas may be a fluorohydrocarbon gas. In this way, the fourth gas is a gas having deposition property.

If the second region Lb is made of $SiO_2$, the first film M1 is formed on the first region La by plasma etching with a gas such as $C_4F_6$. Meanwhile, if the second region Lb is made of SiN, the first film M1 is formed on the first region La by plasma etching with a gas such as $CH_3F$.

Now, an example of forming the first film M1 by the plasma etching will be explained. According to this example, a thickness difference between the first film M1 formed on the first region La and the first film M1 formed on the second region Lb can be further increased. The process ST1$a$ includes a fifth process and a sixth process. The fifth process and the sixth process are performed in the plasma processing apparatus 10. In the process ST1$a$, through the fifth process and the sixth process, the second region Lb is etched by using plasma of the fourth gas, and the first film M1 is formed on the first region La.

First, the plasma of the fourth gas is generated within the processing vessel 12 in which the wafer W is accommodated, and a film is deposited on the surface SFa of the first region La and on the surface SFb of the second region Lb (fifth process). The fifth process includes adjusting a pressure by supplying the fourth gas into the processing vessel 12. Then, the first high frequency power supply 62 is operated to apply the high frequency power, so that the plasma of the fourth gas is generated. In the fifth process, a high frequency power for ion attraction into the wafer W is not applied, or a power not causing etching is applied. Accordingly, the film is formed on the surface SFa of the first region La and the surface SFb of the second region Lb.

Subsequently, in the sixth process, the second region Lb is removed. In the sixth process, an inert gas is supplied into the processing vessel 12. By operating the first high frequency power supply 62, the high frequency power is supplied, and plasma of the inert gas is generated. In this sixth process, the high frequency power may be applied by operating the second high frequency power supply 64. As a result, ions of the inert gas are attracted into the film deposited in the fifth process. As the deposited film and a part of the second region Lb react with each other, the part of the second region Lb is removed. In this etching, 1 to 10 atomic layers of the second region Lb are etched (referred to as pseudo-ALE) per a single cycle including the fifth process and the sixth process. Meanwhile, as for a reaction between the deposited film and the first region La, it is difficult to generate a reaction product having high volatility. Thus, the first region La is difficult to remove as compared to the second region Lb. For this reason, the first film M1 is formed on the first region La. The fifth process and the sixth process are repeated until an etching amount of the second region Lb reaches a preset amount. Upon the completion of this etching, the film is completely or mostly removed from the second film Lb. This etching method improves selectivity for a deposition amount of the first film M1. Here, though the pseudo-ALE is used as an example of forming the first film by etching, the second region Lb may be etched by another method and the first film M1 may be formed on the first region La.

In the present exemplary embodiment, the first region La has the first material containing any of silicon, an organic material and a metal. To be specific, the first material of the first region La may by any one of, by way of non-limiting example, Si, SiGe, Ge, SiN, SiC, an organic film, a metal (W, Ti, or the like), SiON and SiOC, or a combination of any two or more thereof. The second region Lb includes the second material different from the first material forming the first region La, and may contain silicon and oxygen. To be more specific, the second region Lb has the second material containing $SiO_2$, SiON, SiOC, or the like. The fourth gas may be a fluorocarbon-based gas such $C_4F_6$ or $C_4F_8$. The fourth gas may further contain an inert gas. The inert gas used in the sixth process may include a rare gas such as an argon gas.

Further, as another example, the first region La may contain any of silicon, an organic material and a metal, and the second region Lb may contain silicon and nitrogen. To be specific, the first region La may contain any of, by way of non-limiting example, Si, SiO$_2$, SiC, an organic film, a metal (W, Ti, or the like), SiON and SiOC, and the second region Lb may contain any of SiN, SiON, and so forth. In this example, the fourth gas may be any of various fluorohydrocarbon-based gases. The fourth gas may further contain an inert gas. The inert gas used in the sixth process may include a rare gas such as an argon gas.

Now, reference is made back to FIG. 7. The process ST5 is a process of forming the second film M2 by ALD on the second region Lb while removing the first film M1. In this way, in the process ST5, the second film M2 (see FIG. 8B) is selectively formed on the surface of the wafer W by ALD. The process ST5 includes a plasma processing, and the first film M1 on the first region La is removed through repetition of the corresponding plasma processing.

In the process ST5 of forming the second film M2, a total processing time of the process ST2c may be adjusted depending on a preset target value of the thickness of the second film M2.

The process ST5 includes the sequence SQ1 and the process ST3. The sequence SQ1 includes the process ST2a, the process ST2b, the process ST2c and, selectively, the process ST2d. The sequence SQ1 may selectively include a process ST2e after the process ST2d. The process ST2e is a process of generating plasma of an inert gas. Accordingly, the process ST2e densifies the second film M2 formed through the process ST2a, the process ST2b, the process ST2c and the process ST2d. Further, the thickness of the first film M1 may be adjusted through the process ST2e. Processing times of the process ST2c and the process ST2e can be adjusted individually.

The process ST1a and the process ST5 can be performed continuously in the same plasma processing apparatus 10 without breaking a vacuum state. Meanwhile, the process ST1a and the process ST5 may be performed in different plasma processing apparatuses. In case that the process ST1a and the process ST5 are performed in the different plasma processing apparatuses, the first film M1 is selectively formed in the process ST1a in one plasma processing apparatus. Then, in the process ST5, in the other plasma processing apparatus 10 different from the one plasma processing apparatus, the second film M2 is selectively formed by the ALD method on the exposed surface of the wafer W having the first film M1 selectively formed thereon. The first film M1 on the first region La is removed while the second film M2 is being formed by repeating the sequence SQL To elaborate, plasma of a modification gas in the process ST2c or plasma of the inert gas in the process ST2e selectively performed removes the first film M1 on the first region La. The removal amount of the first film can be controlled by adjusting the processing time of the process ST2c and the value of the first or second high frequency power in the process ST2c.

The second gas G1 (precursor gas) used in the process ST2a is a gas which is adsorbed to a region of the wafer W where the first film M1 is not formed (the first film M1 hampers adsorption of the second gas), and which forms an adsorption layer (layer Ly1 shown in FIG. 6A to FIG. 6C). The second gas G1 may be an aminosilane-based gas, a silicon-containing gas, a titanium-containing, a hafnium-containing gas, a tantalum-containing gas, a zirconium-containing gas, or an organic-containing gas. The third gas used in the process ST2c is a gas which modifies the adsorption layer, and may be, by way of example, but not limitation, an oxygen-containing gas, a nitrogen-containing gas or a hydrogen-containing gas.

To elaborate, an O$_2$ gas, a CO$_2$ gas, a NO gas, a SO$_2$ gas, a N$_2$ gas, a H$_2$ gas, a NH$_3$ gas, or the like may be used as the third gas. Further, an ozone gas (O$_3$ gas) may also be used as the third gas, and plasma need not be generated in the process ST2c.

FIG. 8A to FIG. 11 illustrate the processing performed in the process ST5. As depicted in FIG. 8A and FIG. 10, the first film M1 is selectively formed on the surface SFa of the first region La in the process ST1a. The wafer W has the first regions La. The first film M1 is selectively formed on the first regions. In the exemplary embodiment, the first films M1 may have different thicknesses on the individual first regions.

A line LP1 and a line LP2 shown in FIG. 10 indicate a variation of the thickness of the first film M1 formed on the surface SFa of the first region La. A line LP3 shown in FIG. 10 indicates a variation of the thickness of the second film M2 formed on the surface SFb of the second region Lb. A line LP4 shown in FIG. 10 indicates a variation of the thickness of the second film M2 formed on the surface SFa when the process ST5 of forming the second film M2 is continuously performed after the first film M1 is removed from the surface SFa of the first region La.

On the surface SFb of the second region Lb, the first film M1 is not formed through the process ST1a, as illustrated in FIG. 8A and FIG. 10, or the first film M1 is formed in a thickness smaller than that of the first film M1 formed on the surface SFa, as illustrated in FIG. 8A and FIG. 11.

A line LP1a and a line LP2a shown in FIG. 11 indicate a variation of the thickness of the first film M1 formed on the surface SFb of the second region Lb in case that the first film M1 is formed on the surface SFb.

As illustrated in FIG. 9A, FIG. 9B, FIG. 10 and FIG. 11, if the process ST5 is begun at a timing TM1, the first film M1 is removed stage by stage as the process ST5 is repeated (the line LP2 of FIG. 10, and the line LP2 and the line LP2a of FIG. 11). Meanwhile, as the process ST5 is repeated, the second film M2 are formed by atomic layer on the surface SFb of the second region Lb where the first film M1 is not formed or on the surface SFb of the second region Lb from which the first film M1 is removed (the lines LP3 of FIG. 10 and FIG. 11).

In the exemplary embodiment, the process ST5 may be performed continuously from the timing TM1 to a timing TM2 when the first film M1 on the surface SFa of the first region La is completely removed. FIG. 9A and FIG. 9B illustrate an example where the process ST5 is repeated three times. That is, FIG. 9A and FIG. 9B illustrate the example the entire first film M1 on the first region La is removed as the process ST5 is repeated three times.

At the moment when the process ST5 is first performed at the timing TM1, the surface SFb of the second region Lb is exposed, but the surface SFa of the first region La is not exposed by being covered with the first film M1. As the process ST5 is first performed at the timing TM1, a part of the first film M1 covering the first region La is removed. The second film M2 of a single atomic layer is formed on the exposed second region Lb.

Then, as the process ST5 is performed the second time, a part of the first film M1 on the first region La is further removed, and another one atomic layer is formed on the second film M2 on the second region Lb, so that the second film M2 of two atomic layers is formed. Subsequently, as the process ST5 is performed the third time, the first film M1 on the first region La is completely removed, and another one atomic layer is formed on the second film M2 on the second region Lb, so that the second film M2 of three atomic layers is formed. As stated, at the timing TM2 when the repetition of the process ST5 is performed three times, the entire first film M1 on the first region La is removed, so that the surface SFa of the first region La is exposed, and the second film M2 having the three atomic layers is formed on the second region Lb.

As illustrated in FIG. 9A, FIG. 9B, FIG. 10, and FIG. 11, the process ST5 may be continuously performed from the timing TM1 to the timing TM2 when the entire first film M1 on the surface SFa of the first region La is removed, but not limited thereto. In another exemplary embodiment, the process ST5 may be performed continuously until the first film M1 or the second film M2 reaches a predetermined thickness. By way of example, the process ST5 may be performed even after the timing TM2 when the first film M1 on the surface SFa is completely removed. In this case, as the process ST5 is performed every single time, the second film M2 is formed on the (exposed) surface SFa of the first region La by every single atomic layer and on the second region Lb by every single atomic layer, as shown in FIG. 9A and FIG. 9B after the timing TM2 and as shown by the lines LP4 in FIG. 10 and FIG. 11.

FIG. 9A and FIG. 9B illustrate the example where the process ST5 is repeated three times (cycles) after the timing TM2. As the process ST5 is repeated three times after the timing TM2, the second film M2 having three atomic layers is formed on the first region La, and the second film M2 having six atomic layers is formed on the second region Lb.

In the exemplary embodiment, the first film M1 is formed to have different thicknesses on different regions of the wafer W. As the ALD cycle is repeated, the second film M2 is formed to have different thicknesses on the different regions. That is, the second film M2 may be formed to have multiple thicknesses based on the multiple thicknesses of the first film M1.

Several specific examples of processing conditions that can be used in the process ST1a, the process ST2a and the process ST2c are specified in experimental examples 1 to 3 as follows.

Experimental Example 1

Material of the first region La: SiN
Material of the second region Lb: $SiO_2$
<Process ST1a>
Internal pressure of the processing space Sp: 20 mTorr
Power from the first high frequency power supply 62: 500 W
Power from the second high frequency power supply 64: 0 W
Flow rate of the first gas: $C_4F_6$ gas (15 sccm)/Ar gas (350 sccm)/$O_2$ gas (20 sccm)
Temperature of the wafer W: 200° C.
Processing time: 10 sec
The first film M1 formed in this Example 1 is a fluorocarbon film.
<Process ST2a>
Internal pressure of the processing space Sp: 100 mTorr
Power from the first high frequency power supply 62: 0 W
Power from the second high frequency power supply 64: 0 W
Flow rate of first gas: aminosilane-based gas (50 sccm)
Temperature of the wafer W: 80° C.
Processing time: 15 sec Experimental Example 2

Material of the first region La: SiN
Material of the second region Lb: $SiO_2$
<Process ST1a>
The etching processing using the fifth process and the sixth process is performed.
Repetition number of the fifth process and the sixth process: 2 times (twice)
The first film M1 formed in this Example 2 is a fluorocarbon film.
<Fifth Process>
Internal pressure of the processing space Sp: 30 mTorr
Power from the first high frequency power supply 62: 100 W
Power from the second high frequency power supply 64: 0 W
Voltage from the DC power supply 70: −300 V
Flow rate of the fourth gas: $C_4F_6$ gas (16 sccm)/Ar gas (1000 sccm)/$O_2$ gas (10 sccm)
Processing time: 3 sec
<Sixth Process>
Internal pressure of the processing space Sp: 30 mTorr
Power from the first high frequency power supply 62: 500 W
Power from the second high frequency power supply 64: 0 W
Voltage from the DC power supply 70: −300 V
Flow rate of the fourth gas: $C_4F_6$ gas (0 sccm)/Ar gas (1000 sccm)/$O_2$ gas (0 sccm)
Processing time: 5 sec
<Process ST2a>
Internal pressure of the processing space Sp: 100 mTorr
Power from the first high frequency power supply 62: 0 W
Power from the second high frequency power supply 64: 0 W
Flow rate of the first gas: aminosilane-based gas (50 sccm)
Temperature of the wafer W: 80° C.
Processing time: 15 sec
<Process ST2c>
Internal pressure of the processing space Sp: 200 mTorr
Power from the first high frequency power supply 62 (frequency: 60 MHz): 500 W
Power from the second high frequency power supply 64 (frequency: 10 kHz): 300 W
Flow rate of the first gas: $CO_2$ gas (300 sccm)
Processing time: 5 sec Experimental Example 3

Material of the first region La: SiN
Material of the second region Lb: $SiO_2$
<Process ST1a>
The etching processing using the fifth process and the sixth process is performed.
Repetition number of the fifth process to the sixth process: 2 times (twice)
The first film M1 formed in this Example 3 is a fluorocarbon film.
<Fifth Process>
Internal pressure of the processing space Sp: 30 mTorr
Power from the first high frequency power supply 62: 100 W
Power from the second high frequency power supply 64: 0 W
Voltage from the DC power supply 70: −300 V (this condition can be omitted)
Flow rate of the fourth gas: $C_4F_6$ gas (16 sccm)/Ar gas (1000 sccm)/$O_2$ gas (10 sccm)
Processing time: 3 sec <Sixth Process>
Internal pressure of the processing space Sp: 30 mTorr
Power from the first high frequency power supply 62: 500 W
Power from the second high frequency power supply 64: 0 W
Voltage from the DC power supply 70: −300 V
Flow rate of the fourth gas: $C_4F_6$ gas (0 sccm)/Ar gas (1000 sccm)/$O_2$ gas (0 sccm)
Processing time: 5 sec
<Process ST2a>
Internal pressure of the processing space Sp: 100 mTorr
Power from the first high frequency power supply 62: 0 W
Power from the second high frequency power supply 64: 0 W
Flow rate of the first gas: aminosilane-based gas (50 sccm)
Temperature of the wafer W: 80° C.
Processing time: 15 sec
<Process ST2c>
Internal pressure of the processing space Sp: 200 mTorr
Power from the first high frequency power supply 62 (frequency: 60 MHz): 500 W
Power from the second high frequency power supply 64 (frequency: 10 kHz): 300 W
Flow rate of the first gas: $CO_2$ gas (300 sccm)
Processing time: 2 sec The experimental example 2 and the experimental example 3 are different in the processing times of the process ST2c. The processing time (2 sec) of the process ST2c in the experimental example 3 is ⅖ times the processing time (5 sec) of the process ST2c in the experimental example 2. In this case, a removal rate of the first film M1 on the surface SFa of the first region La in the experimental example 3 equals to about ⅖ times the removal rate in the experimental example 2.

Furthermore, the surface of the wafer W may be cleaned after the process ST1a and before the process ST5 (process ST1b). The process ST1b may be performed in case that the first film M1 is formed on the second region Lb to remove the first film M1 from the second region Lb. The second film M2 is not formed on the second region Lb from the beginning of the ALD process ST5 until the time when the first film M1 on the second region Lb is completely removed. The second film M2 starts to be formed after the first film M1 is removed from the second region Lb. Thus, by performing the cleaning of the process ST1b, the formation of the second film M2 can be begun from the beginning of the process ST5. Therefore, the repetition number of the process ST5 required to allow the second film M2 to reach a required thickness can be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

Other aspects according to the exemplary embodiments include Remarks 1 to 4 as follows.

(Remark 1)
A method of processing a target object, comprising: providing the target object having a first film being selectively formed on a surface of the target object, forming a second film by atomic layer deposition (ALD) on the surface of the target object while removing the first film.

(Remark 2)
A method of processing a target object, comprising: forming a first film selectively on a first region of the target object; forming a first atomic-layer-deposited film (ALD film) on a second region of the target object where the first film is not formed; and forming a second ALD film on the first region after the first film on the first region is removed by repeating the ALD.

(Remark 3)
The method of Remark 2 in which the first ALD film is thicker than the second ALD film.

(Remark 4)
A method of processing a target object, comprising: preparing the target object having a first region made of a first material and a second region made of a second material different from the first material; etching the first region with plasma of a first gas to form a first film on the second region; and forming a second film on the first region by ALD while removing the first film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A method of processing a target object, the method comprising:
   providing, in a processing vessel, the target object having an etching target layer and a mask provided on the etching target layer, the mask being provided with an opening reaching the etching target layer;
   (a) etching the etching target layer through the opening using a plasma generated from a first gas containing a carbon atom and a fluorine atom to form a first film on an upper area of the opening; and
   (b) forming a second film on an area other than the upper area of the opening where the first film is not formed, wherein (b) includes:
   (i) exposing the target object to a second gas containing a non-plasma organic-containing aminosilane-based gas to form a precursor layer, and
   (ii) generating plasma from a third gas containing modification gas to modify the precursor layer.

2. The method of claim 1,
   wherein the etching target layer is a hydrophilic insulating layer containing silicon.

3. The method of claim 1,
wherein, in (a), the etching target layer is etched through the opening while a temperature of the target object is adjusted to be uniform across regions of the target object.

4. The method of claim 1,
wherein the processing vessel is provided with a first gas inlet opening and a second gas inlet opening,
the first gas inlet opening is provided above the target object,
the second gas inlet opening is provided at a side of the target object,
in (a), the first gas is supplied into the processing vessel from the first gas inlet opening and a backflow prevention gas is supplied into the processing vessel from the second gas inlet opening,
in (a), the second gas is supplied into the processing vessel from the second gas inlet opening and the backflow prevention gas is supplied into the processing vessel from the first gas inlet opening,
in (b), the third gas is supplied into the processing vessel from the first gas inlet opening and the backflow prevention gas is supplied into the processing vessel from the second gas inlet opening, and
a pipeline connected to the first gas inlet opening and a pipeline connected to the second gas inlet opening are not intersected with each other.

5. The method of claim 1,
wherein the first gas includes a fluorocarbon-based gas.

6. The method of claim 1,
wherein the second gas includes monoaminosilane.

7. The method of claim 1,
wherein the aminosilane-based gas contained in the second gas includes aminosilane having 1 to 3 silicon atoms.

8. The method of claim 1,
wherein the aminosilane-based gas contained in the second gas includes aminosilane having one to three amino groups.

9. A method of processing a target object, the method comprising:
(a) providing the target object having a first region and a second region;
(b) forming a first film on the first region; and
(c) forming a second film on the second region,
wherein (c) includes repeating a sequence comprising:
(i) forming an adsorption layer on a surface of the target object by exposing the target object to a precursor; and
(ii) generating a plasma from a modification gas to form the second film by modifying the adsorption layer and to remove the first film from the first region.

10. The method of claim 9, further comprising,
after (b) and prior to (c), removing the first film formed on a region other than the first region by using plasma.

11. The method of claim 9, further comprising,
after (b) and prior to (c), adjusting a film thickness of the first film formed on the first region.

12. The method of claim 9,
wherein the target object has an etching pattern, the first region is an upper region of the etching pattern, and the second region is a lower region of the etching pattern.

13. The method of claim 12,
wherein the first film is formed on a side wall of the etching pattern to be thicker at an upper region, but not formed on a bottom surface of the etching pattern, and
the second film is formed on the bottom surface of the etching pattern, but not formed on the upper region of the side wall of the etching pattern.

14. The method of claim 9,
wherein (b) includes respectively adjusting temperatures of respective regions of the target object.

15. The method of claim 9,
wherein (b) includes etching the target object.

16. The method of claim 12,
wherein the target object has an etching target layer and a mask provided on the etching target layer.

17. The method of claim 9,
wherein the first film includes a carbon and a fluorine, and the second film includes a silicon.

18. The method of claim 17,
in (ii), at least one atomic layer is removed from a surface of the first film.

19. The method of claim 9,
wherein (c) further includes, exposing the target layer to an inert gas after (ii).

20. The method of claim 9,
wherein the method is performed within a processing vessel.

21. The method of claim 20,
wherein (i) includes, supplying a precursor gas into the processing vessel.

* * * * *